United States Patent
Mizugaki et al.

(10) Patent No.: US 6,545,943 B2
(45) Date of Patent: Apr. 8, 2003

(54) ACTIVATION OF WORD LINES IN SEMICONDUCTOR MEMORY DEVICE

(75) Inventors: Koichi Mizugaki, Suwa (JP); Eitaro Otsuka, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/976,164

(22) Filed: Oct. 15, 2001

(65) Prior Publication Data

US 2002/0057607 A1 May 16, 2002

(30) Foreign Application Priority Data

Nov. 8, 2000 (JP) ........................................ 2000-340272

(51) Int. Cl.⁷ ............................................... G11C 7/00
(52) U.S. Cl. ................ 365/233.5; 365/222; 365/230.06
(58) Field of Search ............................ 365/222, 233.5, 365/149, 230.06

(56) References Cited

U.S. PATENT DOCUMENTS 6,392,958 B1 * 5/2002 Lee .......................... 365/233.5
6,396,758 B2 * 5/2002 Ikeda et al. ................. 365/222

FOREIGN PATENT DOCUMENTS

JP 11-297067 10/1999

* cited by examiner

Primary Examiner—Tan T. Nguyen
(74) Attorney, Agent, or Firm—Oliff & Berridge, PLC

(57) ABSTRACT

To provide a technique for reducing the power consumption associated with word line activation in a semiconductor memory device. The semiconductor memory device is provided with a word line activation controller for controlling word line activation. Where consecutive operation cycles use multiple-bit addresses that include an identical row address, the controller maintains an activated state of a word line without deactivation thereof until the row address changes. In the event of a refresh request when a word line in a certain block is in an activated state, the controller can deactivate the word line, with the proviso that no external access is currently being performed in the block. Where a request for external access to the block is made within a predetermined period after the refresh request, the refresh operation for the block is suspended, and the word line for external access is activated.

8 Claims, 20 Drawing Sheets

|  | #CS | ZZ | REFRESH MODE |
|---|---|---|---|
| OPERATION | L | H | MODE 1 |
| STANDBY | H | H | MODE 2 |
| SNOOZE (POWER DOWN) | H | L | MODE 2 |

ACTIVATION OF WORD LINES IN SEMICONDUCTOR MEMORY DEVICE

BACKGROUND OF THE INVENTION

1. Field of the Invention

The present invention relates to control of word line activation in a semiconductor memory device.

2. Description of the Related Art

Commonly used semiconductor memory devices include DRAM and SRAM. It is common knowledge that while DRAM offers higher capacity at lower price than SRAM, it requires refresh operations. SRAM, on the other hand, while easier to use due to the lack of a need for refresh operations, is more expensive and has lower capacity than DRAM.

Virtual SRAM (known as VSRAM or PSRAM) is a semiconductor memory device that offers that advantages of both DRAM and SRAM. Virtual SRAM has a memory cell array composed of dynamic memory cells identical to those in DRAM, and also houses a refresh controller that allows refresh operations to be performed internally. Thus, external devices connected to virtual SRAM (such as a CPU) can access (i.e., read or write data) virtual SRAM without being aware of refresh operations. This feature of virtual SRAM is known as "refresh transparency."

During each cycle in which virtual SRAM is accessed, the word line selected by an address must be activated and deactivated. However, in instances where, for example, the same word line is activated during consecutive cycles, repeated activation and deactivation of the word line during each cycle represents a waste of power. This problem is not limited to virtual SRAM, being common to all semiconductor memory devices in which word lines are repeatedly activated and deactivated in each cycle.

SUMMARY OF THE INVENTION

An object of the present invention is to provide a technique for reducing the power consumption associated with word line activation in semiconductor memory devices.

At least part of the above and the other related objects is attained by a semiconductor memory device. A semiconductor memory device includes: a plurality of memory cell blocks composed of dynamic memory cells arranged in a matrix, the memory cell block including a plurality of word lines; an address input section for input of a multiple-bit address that includes a block address for selecting any one block from among the plurality of memory cell blocks, and a row address for selecting one of the plurality of word lines in the selected memory cell block; a data input/output section for input/output of data corresponding to a memory cell selected by the multiple-bit address; and a word line activation controller for controlling activation of the word lines. The word line activation controller includes: a row address transition detector for detecting whether the row address has changed. (a) In a first case that the row address transition detector does not detect a change in the row address during consecutive cycles in which read or write operations of data for the memory cells are enabled and in which an identical row address is used, the word line activation controller can maintain an activated state of a word line activated in a first memory cell block during an initial cycle of the consecutive cycles, without deactivation thereof until a final cycle of the consecutive cycles. (b) In a second case that a refresh request is issued to perform a refresh operation on the first memory cell block while the activated word line in the first memory cell block is maintained in the activated state, the word line activation controller can deactivate the activated word line in the first memory cell block if no read or write operations of data are currently being performed in the first memory cell block. (c) In a third case that a read or write operation for the first memory cell block is requested within a predetermined period after the issuance of the refresh request to the first memory cell block, the word line activation controller can suspend the refresh operation for the first memory cell block, and activate the deactivated word line in the first memory cell block for the read or write operation of data.

The semiconductor memory device herein includes a word line activation controller. Where consecutive cycles use addresses that include the same given row address, the word line activation controller maintains a word line activated during the initial cycle in the activated state until the final cycle in which this same row address is used. In the event of a refresh request, the word line activation controller can deactivate the activated word line without waiting for the final cycle.

The word line activation controller herein can perform refresh operations in the semiconductor memory device, and also obviates the need to repeatedly activate and deactivate word lines in each cycle during periods in which no refresh operations are being performed, thereby reducing the power consumption associated with word line activation.

The advantages of the device herein are particularly notable in cases where data read/write operations on memory cells on an activated word line are performed in two or more cycles among a plurality of cycles that extend from an initial cycle to a final cycle.

When a data read or write operation is requested within a predetermined period after a request to perform a refresh operation, the refresh operation is suspended, and the word line for the data read or write operation is activated, whereby priority can be given to data read or write operations.

In the semiconductor memory device, it is preferable that the address input section is simultaneously supplied with a column address as well as with the row address; and the row address is assigned to a plurality of upper bits of the multiple-bit address.

By assigning the row address to a plurality of upper bits, the row address becomes relatively less likely to change, so that word lines can be more frequently maintained in the activated state, thereby reducing the power consumption associated with word line activation.

In the semiconductor memory device, it is also preferable that the predetermined period is substantially equal to a period required for precharging bit lines in the first memory cell block.

In this way precharging can be performed during the cycle period just prior to the cycle for which the data read or write operation has been requested, whereby individual cycle length can be made relatively short.

In the semiconductor memory device, it is preferable that the word line activation controller is capable of: in the first case, maintaining the activated state of the word line activated in the first memory cell block during the initial cycle, without deactivation thereof until the final cycle; and additionally, when a read or write operation of data on a memory cell in a second memory cell block different from the first memory cell block is performed during any arbitrary cycle among the consecutive cycles after the initial cycle, maintaining an activated state of a word line activated in the second memory cell block during the arbitrary cycle, without deactivation thereof until the final cycle. And it is preferable that the word line activation controller is capable of: in the second case, where a refresh request is issued for a refresh operation on the second memory cell block as well as on the first memory cell block, deactivating the activated word line in the second memory cell block if no read or write operations of data are currently being performed in the second memory cell block.

The arbitrary cycle among the consecutive cycles after the initial cycle may be a cycle other than the final cycle, or the final cycle.

With this word line activation controller, word lines can be held in the activated state in two or more memory cell blocks at the same time, thus enabling more frequent data read/write operations to memory cells on activated word lines during periods that no refresh operations are being performed. This reduces the power consumption associated with word line activation. When a refresh operation is requested, the activated word lines can be deactivated without waiting for the final cycle, and the refresh operation performed.

The present invention is also directed to a method for controlling activation of word lines in a semiconductor memory device. The semiconductor memory device includes: a plurality of memory cell blocks composed of dynamic memory cells arranged in a matrix, the memory cell block including a plurality of word lines; an address input section for input of a multiple-bit address that includes a block address for selecting any one block from among the plurality of memory cell blocks, and a row address for selecting one of the plurality of word lines in the selected memory cell block; and a data input/output section for input/output of data corresponding to a memory cell selected by the multiple-bit address. (a) In a first case that no change in the row address is detected during consecutive cycles in which read or write operations of data for the memory cells are enabled and in which an identical row address is used, an activated state of a word line activated in a first memory cell block during an initial cycle of the consecutive cycles is maintained without deactivation thereof until a final cycle of the consecutive cycles. (b) In a second case that a refresh request is issued to perform a refresh operation on the first memory cell block while the activated word line in the first memory cell block is maintained in the activated state, the activated word line in the first memory cell block is deactivated if no read or write operations of data are currently being performed in the first memory cell block. (c) In a third case that a read or write operation for the first memory cell block is requested within a predetermined period after the issuance of the refresh request to the first memory cell block, the refresh operation for the first memory cell block is suspended, and the deactivated word line in the first memory cell block for the read or write operation of data is activated.

The method herein affords advantages and effects similar to those derived from use of the device herein.

The invention may be embodied in any of a number of forms, for example, a semiconductor memory device; a word line activation control method therefor; a semiconductor memory system comprising a semiconductor memory device and a control device; a method for controlling a semiconductor memory device; or an electronic device comprising a semiconductor memory device.

These and other objects, features, aspects, and advantages of the present invention will become more apparent from the following detailed description of the preferred embodiments with the accompanying drawings.

DESCRIPTION OF THE PREFERRED EMBODIMENT

An exemplary embodiment of the invention is described in the following order.
A. Summary of memory chip pinout and operating modes:
B. Overall internal arrangement of memory chip:
C. Internal arrangement of word line activation controller:
D. Operation of word line activation controller:
 D1. Operation during operation cycle (with no refresh request):
 D2. Operation during operation cycle (with a refresh request):
 D3. Operation in standby cycle and snooze mode:
E. Example of application in an electronic device:

A. Summary of Memory Chip Pinout and Operating Modes

Figures 1, 2:
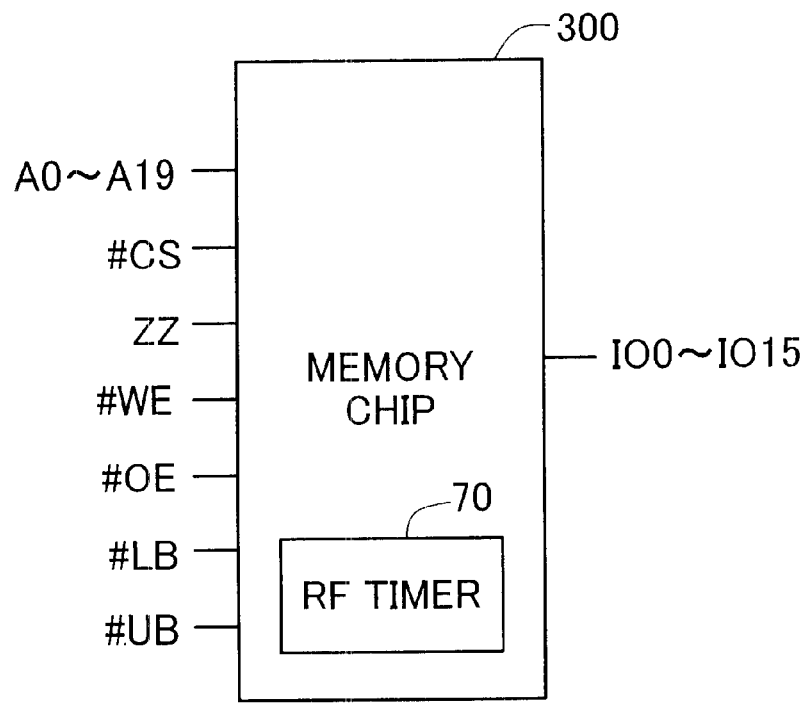
FIG. 1 is an illustrative diagram showing the pinout of a memory chip 300 pertaining to an embodiment of the invention.
FIG. 2 is an illustrative diagram showing the operating modes of memory chip 300 associated with different levels of chip select signal #CS and snooze signal ZZ.
Figure 3:
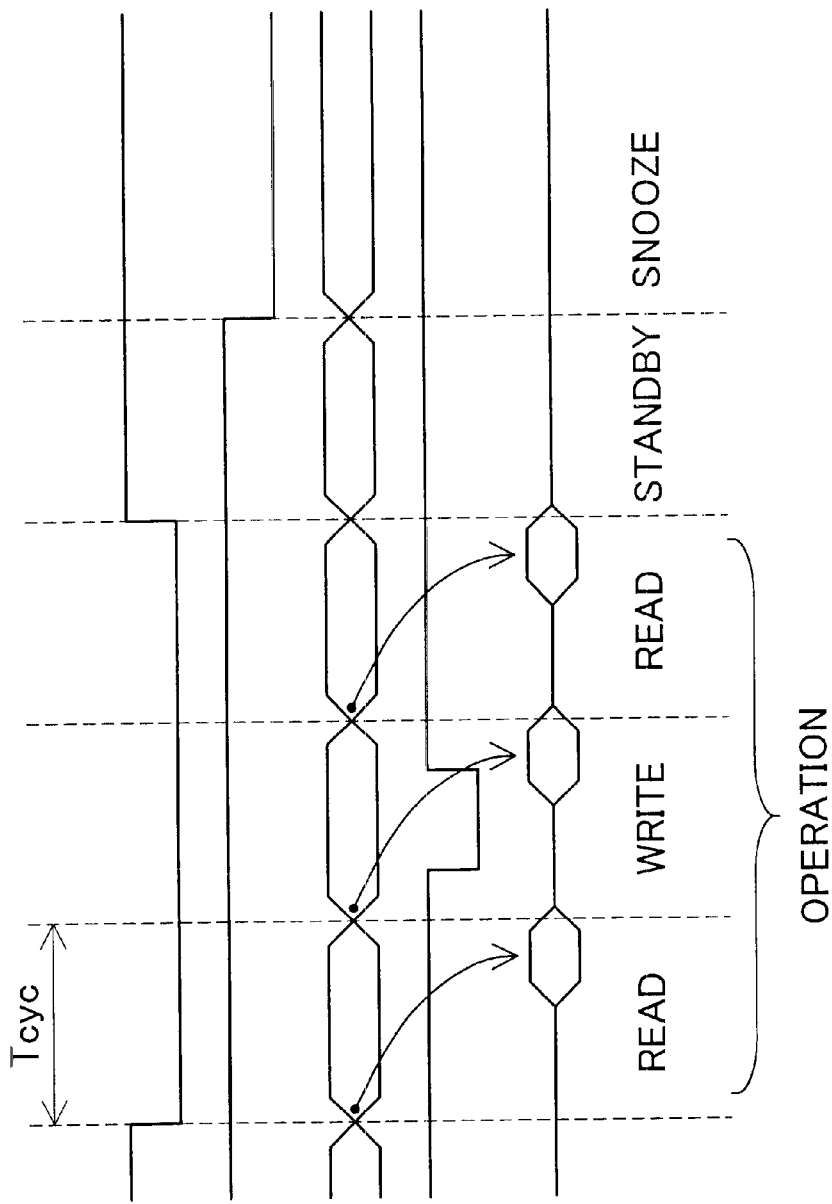
FIGS. 3(a)–3(f) are timing charts summarizing operation of memory chip 300.

FIG. 1 is an illustrative diagram showing the pinout of a memory chip 300 pertaining an embodiment of the invention. Memory chip 300 has the following terminals.
A0–A19: address input terminals (20)
CS: chip select input terminal
ZZ: snooze input terminal
WE: write enable input terminal
OE: output enable input terminal
LB: lower byte enable input terminal
UB: upper byte enable input terminal
IO0–IO15: I/O data terminals (16)

In the following discussion the same symbols are used to denote both the terminal name and the signal name. A "#" preceding a terminal name (or signal name) denotes negative logic. While a plurality of address input terminals A0–A19 and I/O data terminals IO0–IO15 are provided, these are depicted in simplified form in FIG. 1.

Memory chip 300 is configured to function as virtual SRAM (VSRAM) so as to enable access in substantially the same manner as ordinary asynchronous SRAM. However, in contrast to SRAM, it uses dynamic memory cells, and thus requires refreshing within a predetermined period. Accordingly, memory chip 300 has an integrated refresh controller that includes a refresh timer 70. Herein, data read and write operations by external devices (controller devices) shall be referred to as "external access" and refresh operations performed by the integrated refresh controller shall be referred to as "internal refresh" operations or simply "refresh" operations.

The chip select signal #CS and snooze signal ZZ depicted in FIG. 1 are used to control the operating mode of memory chip 300. FIG. 2 is an illustrative diagram showing the operating modes of memory chip 300 associated with different signal levels of chip select signal #CS and snooze signal ZZ. Herein, "H level" refers to "1" level of the two levels of a binary signal, and "L" level refers to "0" level.

When chip select signal #CS is L level (active) and snooze signal ZZ is H level, a read/write operation cycle (hereinafter referred to simply as "operation cycle" or "read/write cycle") is performed. External access is enabled during operation cycles, with internal refresh operations being performed at appropriate times.

When chip select signal #CS and snooze signal ZZ are both H level, a standby cycle is performed. In standby cycle external access is disabled, so all word lines are in the inactive state. However, during an internal refresh operation, the word line indicated by a refresh address is activated.

When chip select signal #CS is H level (inactive) and snooze signal ZZ is L level, memory chip 300 goes into snooze mode (termed "power down mode"). In snooze mode all circuits not needed for refresh operations are halted. Since power consumption in snooze mode is very low, it is suited to backup of data held in memory.

Refresh operations are performed according to a first refresh mode during operation cycles, and according to a second refresh mode in standby cycle and snooze mode. In first refresh mode, refresh operations are performed after the refresh timer 70 has issued a refresh timing signal, and in a manner dependent upon current external access status. In second refresh mode, on the other hand, no external access is performed, so refresh operations are initiated immediately when the refresh timer 70 issues a refresh timing signal. In this way, memory chip 300 performs refresh operations according to refresh modes optimized for each of the three operating modes. Refresh operations in the two refresh modes will be described in greater detail later.

Address A0–A19 shown in FIG. 1 consists of 20 bits, and indicates a megaword address. I/O data IO0–IO15 consists of 16-bit word data. That is, one value of address A0–A19 corresponds to 16 bits (1 word), enabling 16 bits of I/O data IO0–IO15 to be input or output at any one time.

In an operation cycle, when the write enable signal #WE goes to L level a write cycle is performed, and when it goes to H level a read cycle is performed. When output enable signal #OE goes to L level, output by I/O data terminals IO0–IO15 is enabled. Lower byte enable signal #LB and upper byte enable signal #UB are control signals for performing a read or write of only one byte, either the lower byte or the upper byte of a word (16 bits). For example, when lower byte enable signal #LB is set to L level and upper byte enable signal #UB is set to H level, only the lower 8 bits of a word will be read or written. The power supply terminal is not shown in FIG. 1.

FIGS. 3(a)–3(f) are timing charts summarizing operation of memory chip 300. From changes in chip select signal #CS and snooze signal ZZ it may be determined, on an as-needed basis, which of the three states shown in FIG. 2 (operation, standby, or snooze) the device is in. The first three cycles shown in FIGS. 3(a)–3(f) are operation cycles. In an operation cycle, either a read (read cycle) or write (write cycle) is performed, depending on the level of write enable signal #WE. The shortest cycle Tcyc of change in address A0–A19 corresponds to the cycle time (termed "cycle period") of memory chip 300. Cycle time Tcyc is a value set within the range of about 50 ns to about 100 ns, for example.

In the fourth cycle in FIGS. 3(a)–3(f), chip select signal #CS rises to H level, whereupon standby cycle is initiated. In the fifth cycle, snooze signal ZZ additionally drops to L level, whereupon memory chip 300 enters snooze mode.

B. Overall Internal Arrangement of Memory Chip

Figure 4:
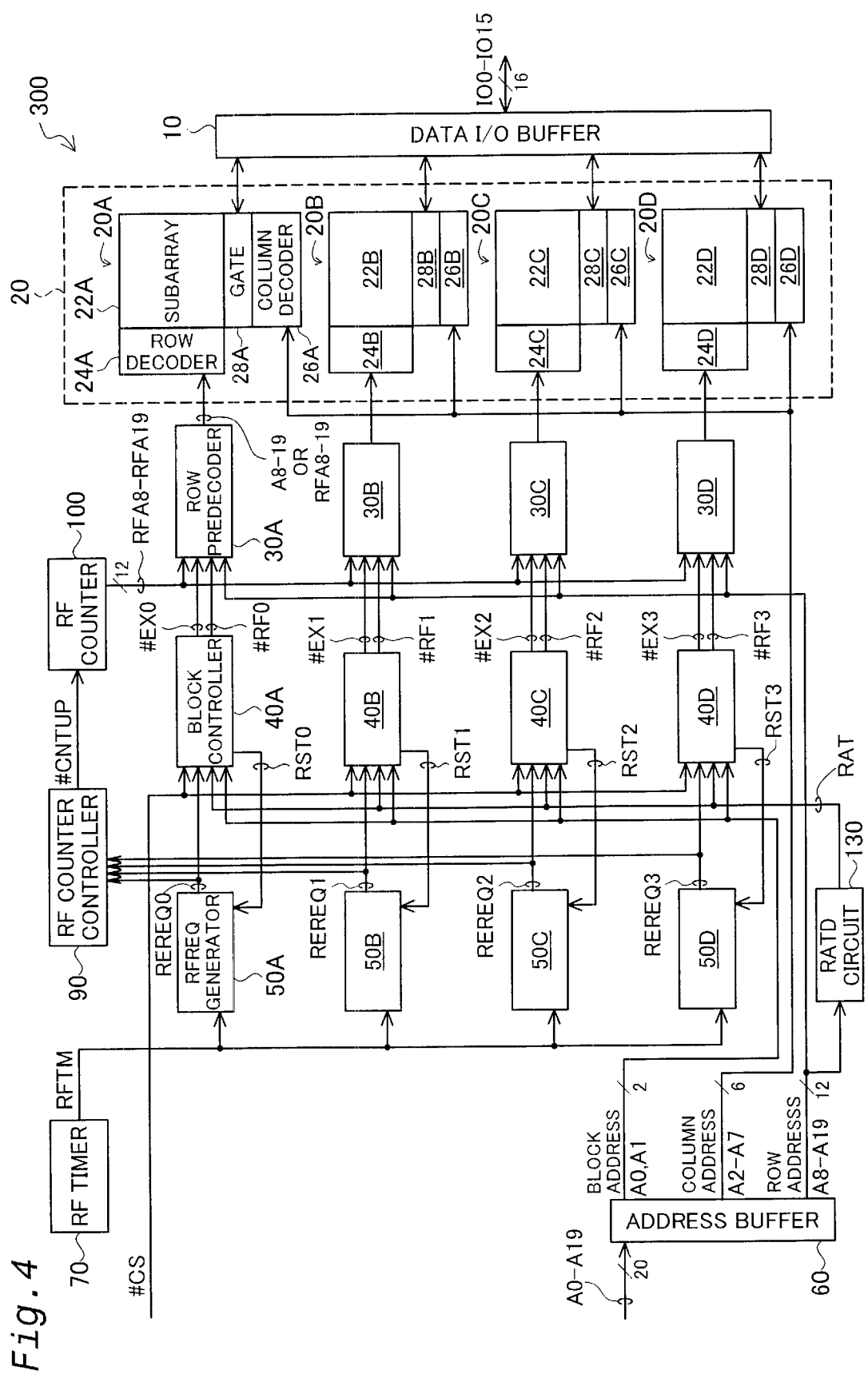
FIG. 4 is a block diagram showing the internal arrangement of memory chip 300.

FIG. 4 is a block diagram showing the internal arrangement of memory chip 300. Memory chip 300 comprises a data I/O buffer 10, a memory array 20, and an address buffer 60.

Memory array 20 is divided into four blocks 20A–20D. The first block 20A has a memory cell subarray 22A, a row decoder 24A, a column decoder 26A, and a gate 28A. The other blocks 20B–20D are analogous in design. As the design of blocks 20A–20D is essentially the same, the following discussion shall focus principally on the first block 20A and its related circuitry.

The arrangement of the one block 20A is similar to that of a typical DRAM memory cell array. Subarray 22A consists of a plurality of 1-transistor/1-capacitor type memory cells in a matrix array. Each memory cell is connected to a word line and a pair of bit lines (also termed "a pair of data lines"). Row decoder 24A includes a row driver, and selects and activates one of the plurality of word lines in subarray 22A in response to a row address supplied to it. Column decoder 26A includes a column driver, and in response to a column address supplied to it simultaneously selects bit line pairs equivalent to one word (16 bits) from among the plurality of bit line pairs in subarray 22A. Gate 28A includes a write circuit and a read circuit, and enables exchange of data between data output buffer 10 and subarray 22A. A precharge circuit, sense amplifier, etc. (not shown) are also provided in block 20A.

Address buffer 60 is a circuit that supplies a 20-bit address A0–A19 from an external device to the other internal circuits. The lowest 2-bit address A0–A1 is used as a block address for selecting one of the four blocks 20A–20D. The 18-bit address above block address A0–A1 is used as a row address and column address. In the present embodiment, the 6-bit address A2–A7 above block address A0–A1 is used as the column address, and the uppermost 12-bit address A8–A19 is used as the row address. Thus, one of the four blocks 20A–20D is selected by means of block address A0–A1, and from the selected block, memory cells equivalent to one word (16 bits) of data are selected by means of column address A2–A7 and row address A8–A19. The word of data from the selected memory cells is either read or written via data I/O buffer 10. That is, an external device can simultaneously access memory cells equivalent to one word in one block by inputting a single address A0–A19.

To each of the blocks 20A–20D are connected, in order, a row predecoder 30A–30D, a block controller 40A–40D, and a refresh request signal generator 50A–50D. Within memory chip 300 are additionally provided a refresh timer 70, a refresh counter controller 90, a refresh counter 100, and a row address transition detecting circuit (hereinafter "RATD circuit") 130.

The refresh timer 70 shown in FIG. 4 is a circuit that generates a refresh timing signal RFTM according to a predetermined refresh cycle. Refresh timer 70 is composed of a ring oscillator, for example. The refresh cycle is set to about 32 $\mu$s, for example.

Refresh request signal generators 50A–50D generate refresh request signals RFREQ0–RFREQ3 for blocks 20A–20D in response to refresh timing signals RTFM supplied by refresh timer 70. These refresh request signals RFREQ0–RFREQ3 are provided respectively to the corresponding block controllers 40A–40D.

Block controllers 40A–40D are supplied with refresh request signals RFREQ0–RFREQ3 as well as with a block address A0–A1 supplied by an external device. Refresh request signals RFREQ0–RFREQ3 indicate that refresh operations should be initiated in the four blocks 20A–20D. In an operating cycle, the block address A0–A1 indicates which of the four blocks 20A–20D external access to is requested. In response to signals RFREQ0–RFREQ3 and address A0–A1, block controllers 40A–40D execute arbitration between external access and internal refresh operations for the four blocks. This arbitration is done by setting the respective output levels of external access signals #EX0–#EX3 and refresh signals #RF0–#RF3.

In response to the levels of external access signals #EX0–#EX3 and refresh signals #RF0–#RF3, row predecoders 30A–30D each select either a row address A8–A19 given from the external device, or a refresh address RFA8–RFA19 given from refresh counter 100, and supply this to row decoders 24A–24D. Selection of the two kinds of addresses A8–A19 and RFA8–RFA19 is performed independently by each row predecoder.

The design and operation of refresh request signal generators 50A–50D, block controllers 40A–40D, and row predecoders 30A–30D will be discussed more later.

Refresh counter controller 90 detects whether refresh operations for a same given refresh address RFA8–RFA19 have been completed in all four blocks 20A–20D. As will be described later, detection is accomplished by checking for changes in the levels of the four refresh request signals RFREQ0–RFREQ3. When refresh operations in all four blocks 20A–20D have been completed, the refresh counter controller 90 supplies a countup signal #CNTUP to refresh counter 100. In response to countup signal #CNTUP, refresh counter 100 then increments by 1 the value of refresh address RFA8–RFA19.

In addition to the circuits depicted in FIG. 4, memory chip 300 also has a controller for controlling the operating mode of circuits in the chip according to chip select signal #CS and snooze signal ZZ, and a controller for controlling I/O status according to the enable signals #WE, #OE, #LB, and #UB; however, for convenience these have been omitted from FIG. 4.

The data I/O buffer 10 and address buffer 60 depicted in FIG. 4 correspond respectively to the "data input/output section" and "address input section" herein. Circuits other than data I/O buffer 10, address buffer 60 and memory cell array 20 (i.e. 30A–30D, 40A–40D, 50A–50D, 70, 90, 100, 130) control word line activation in memory cell array 20, and correspond to the "word line activation controller" herein.

The word line activation controller also functions as a refresh controller for controlling refresh operations of memory cell array 20. In particular, the circuits composed of row predecoders 30A–30D, block controllers 40A–40D, and refresh request signal generators 50A–50D have the function of arbitration circuitry for arbitrating between internal refresh and external access operations.

C. Internal Arrangement of Word Line Activation Controller

Figure 5:
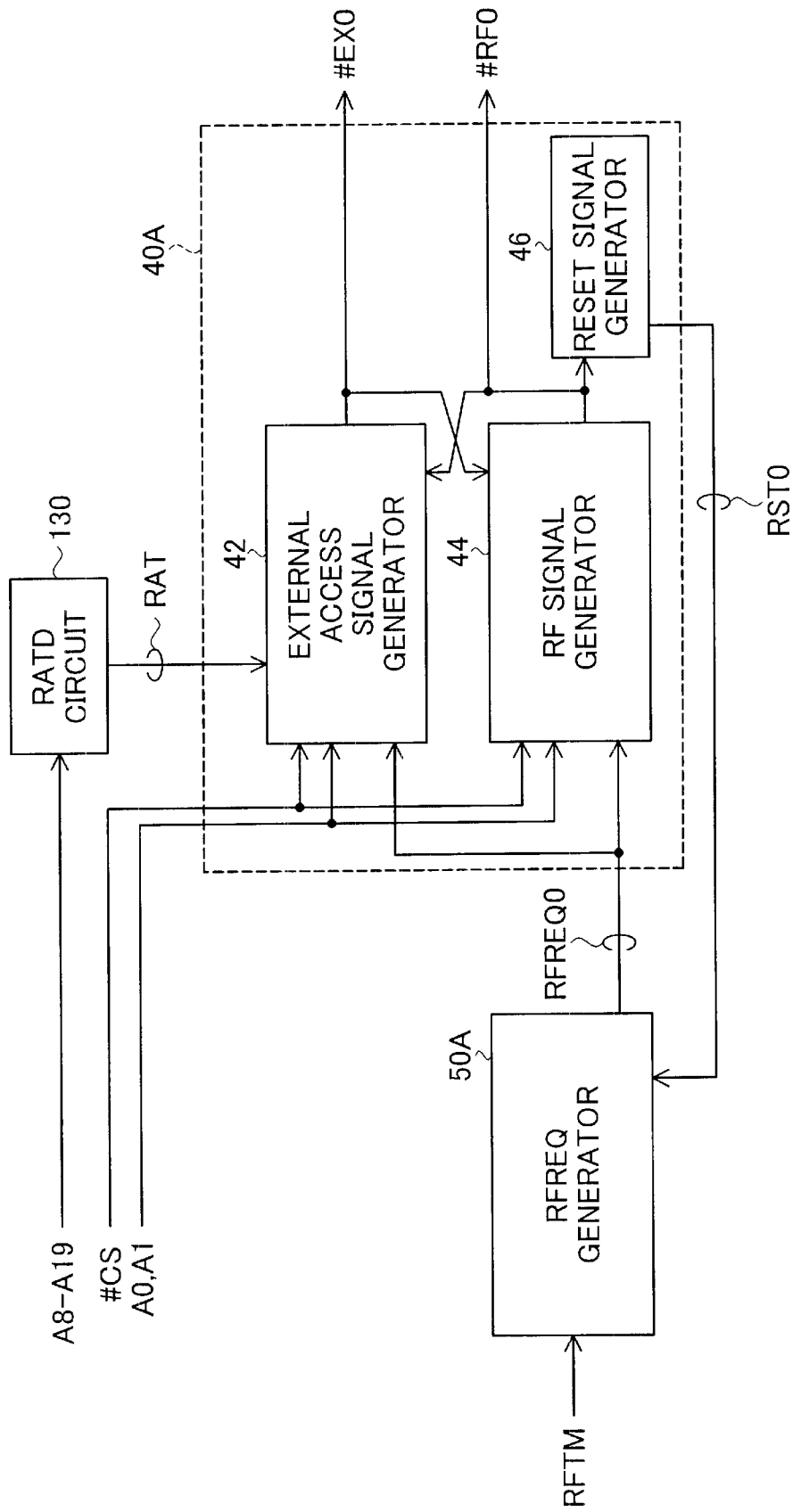
FIG. 5 is a block diagram showing the internal arrangement of the first block controller 40A of FIG. 4.

FIG. 5 is a block diagram showing the internal arrangement of the first block controller 40A of FIG. 4. The other block controllers 40B–40D have the same arrangement shown in FIG. 5.

Block controller 40A comprises an external access signal generator 42 for generating an external access signal #EX0; a refresh signal generator 44 for generating a refresh signal #RF0, and a reset signal generator 46 for generating a reset signal RST0 in response to refresh signal #RF0. External access signal generator 42 and refresh signal generator 44 are each supplied with chip select signal #CS, block address A0–A1, and a refresh request signal RFREQ0 from refresh request signal generator 50A. External access signal generator 42 is supplied with refresh signal #RF0, and refresh signal generator 44 is supplied with external access signal #EX0. External access signal generator 42 is additionally supplied with a row address transition signal RAT (hereinafter "RAT signal") from row address transition detection circuit (hereinafter "RATD circuit") 130.

Row address transition detection circuit (RATD circuit) 130 detects whether there has been any change of any one or more bits in the 12-bit row input address A8–A19 supplied by an external device, and if it detects a change, outputs a RAT signal.

Figure 6:
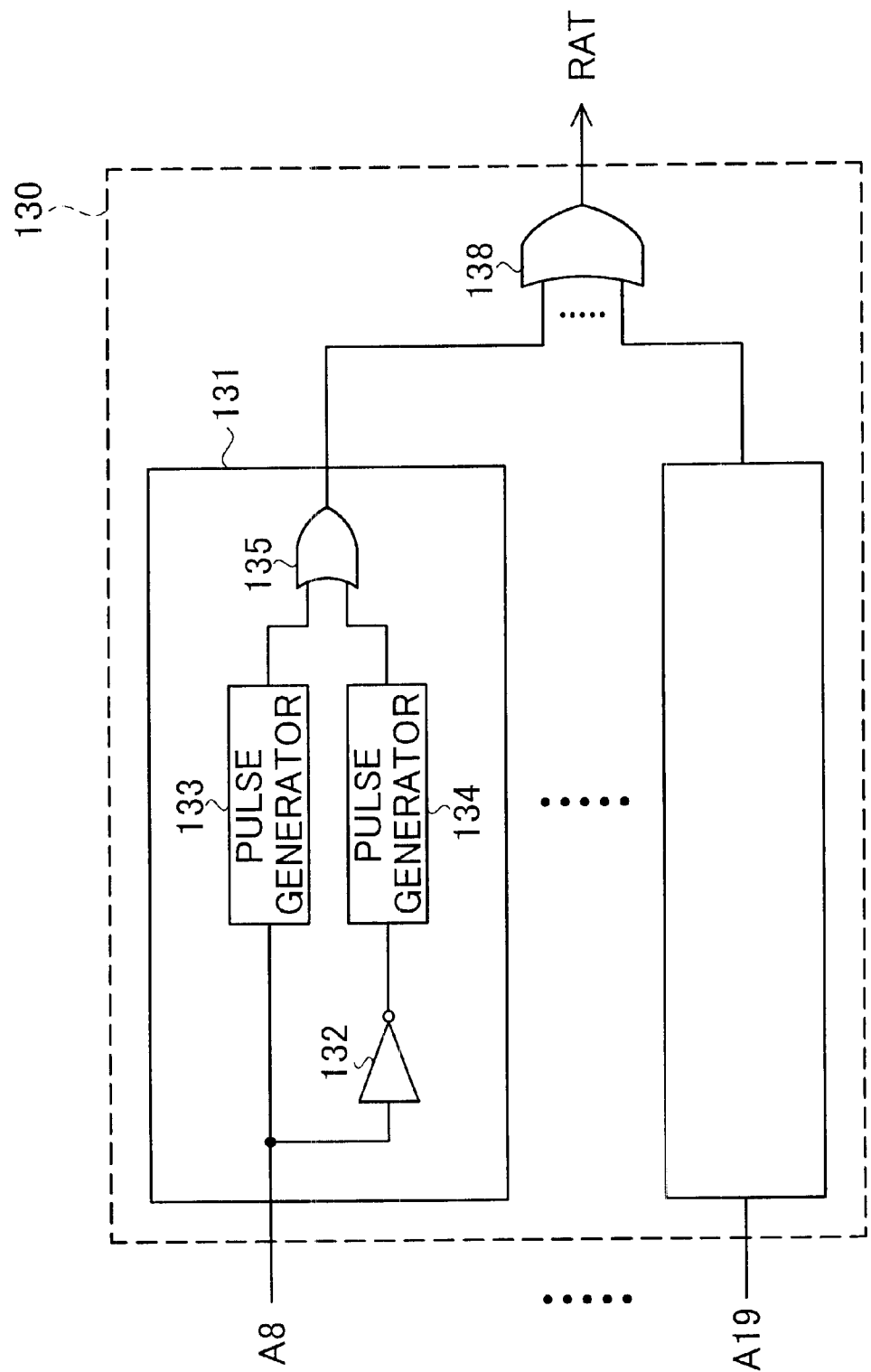
FIG. 6 is a block diagram showing the internal arrangement of the RATD circuit 130 of FIG. 5.

FIG. 6 is a block diagram showing the internal arrangement of the RATD circuit 130 of FIG. 5. RATD circuit 130 comprises twelve transition detection circuits 131—corresponding in number to the bits of the 12-bit row address A8–A19—; and a 12-input OR gate 138. Each transition detection circuit 131 has an inverter 132, two pulse generators 133, 134, and an OR gate 135. One-shot multivibrators may be used for the pulse generators 133, 134.

The first pulse generator 133 generates a single pulse of predetermined pulse width in response to a rising edge of address bit A8. Inverter 132 and second pulse generator 134 generate a single pulse of predetermined pulse width in response to a falling edge of address bit A8. Thus, at each rising edge and falling edge of address bit A8 a single pulse is output from OR gate 135. The procedure is the same for the other address bits A9–A19.

12-input OR gate 138 has as inputs the outputs of the twelve transition detection circuits 131. Thus, any change of one or more bits in the 12-bit row address A8–A19 results in a pulsed RAT signal being output from OR gate 138. As shown in FIG. 4, this RAT signal is supplied to each of the four block controllers 40A–40D.

The refresh request signal generator 50A of FIG. 5 is supplied with the refresh timing signal RFTM. In response to a rising edge of refresh timing signal RFTM, refresh request signal generator 50A immediately brings refresh request signal RFREQ0 up to H level. Refresh request signal generator 50A is also supplied with the reset signal RST0 from reset signal generator 46, and in response to a reset signal RST0 returns refresh request signal RFREQ0 to L level. This cancels the refresh request for block 20A.

Figure 7:
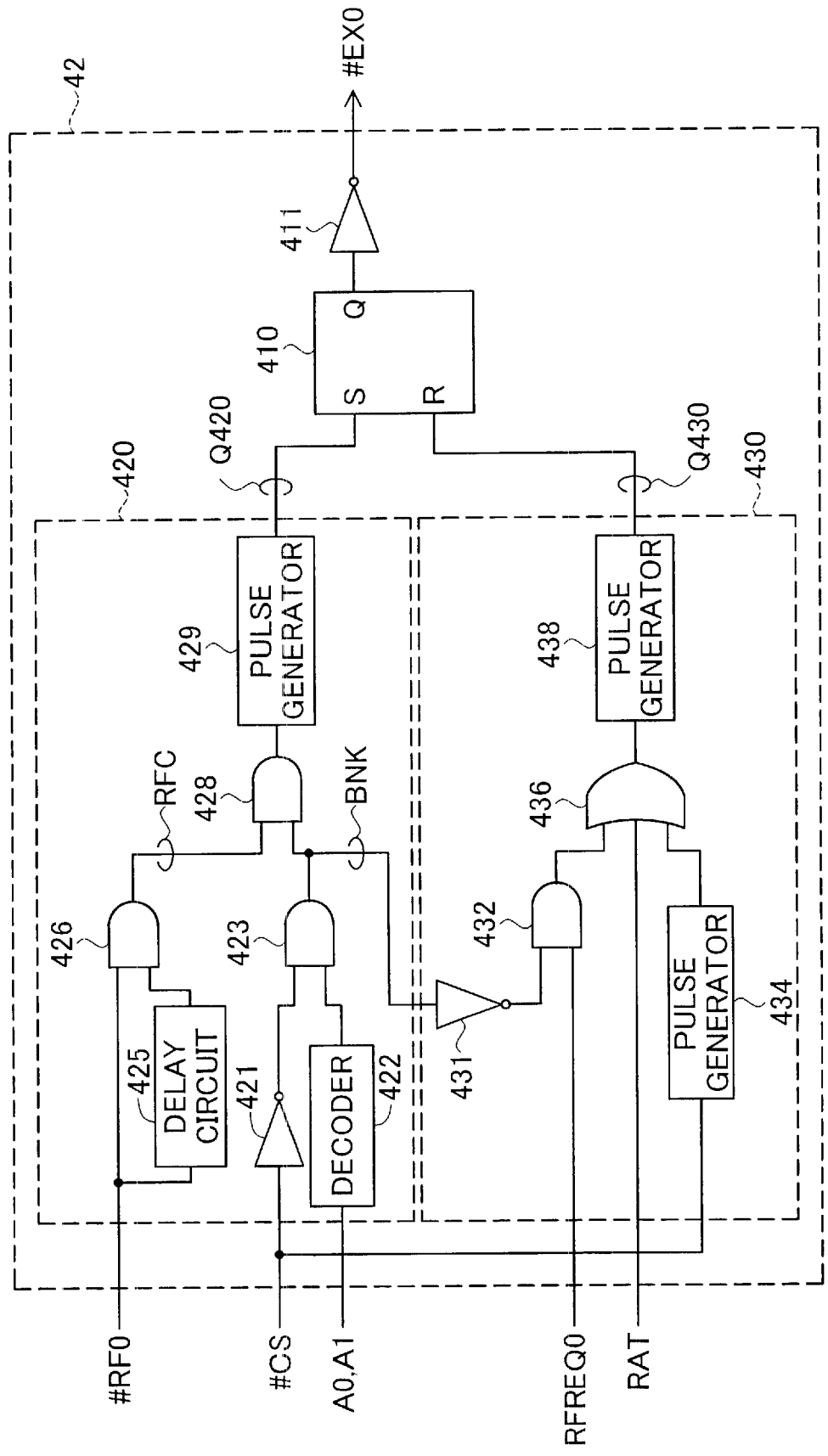
FIG. 7 is a block diagram showing the internal arrangement of the external access signal generator 42 of FIG. 5.

FIG. 7 is a block diagram showing the internal arrangement of the external access signal generator 42 of FIG. 5. External access signal generator 42 comprises an RS latch 410, an inverter 411, a set signal generator 420, and a reset signal generator 430. The output signal Q420 from set signal generator 420 is given to the set terminal S of RS latch 410, and the output signal Q430 from reset signal generator 430 is given to the reset terminal R of RS latch 410.

Set signal generator 420 comprises an inverter 421, a decoder 422, a delay circuit 425, a pulse generator 429, and three AND gates 423, 426, 428.

First AND gate 423 is supplied with a chip select signal #CS inverted by inverter 421, and with the output signal of decoder 422. When chip signal #CS is L level (active) and the value of the block address A0–A1 is "0"—indicating block 20A—first AND gate 423 outputs an H level BNK signal. An H level BNK signal indicates that there is a request for external access to the first block 20A.

Second AND gate 426 is supplied with refresh signal #RF0 and with refresh signal #RF0 via the delay circuit 425. Second AND gate 426 outputs an RFC signal whose L level period is extended by a predetermined delay period Td2 (described later) with respect to the L level (active) period of refresh signal #RF0.

Third AND gate 428 is supplied with the BNK and RFC signals. During a period that the RFC signal is L level, third AND gate 428 limits output of the BNK signal. The output of the third AND gate 428 is given to pulse generator 429.

Set signal generator 420 determines whether there is a request for external access to the first block 20A associated with first block controller 40A, and if there is a request for external access, it supplies a pulse signal Q420 to the set terminal S of RS latch 410. However, during a period associated with performing a refresh operation (i.e. a period over which refresh signal #RF0 is active (L level) and the subsequent predetermined period Td2), set signal generator 420 does not supply a pulse signal Q420 to the set terminal S of RS latch 410, even if there is a request for external access. In response to pulse signal Q420, RS latch 410 and inverter 411 set the external access signal #EX0 to active (L level). When external access signal #EX0 goes to active (L level), the word line selected by the row address A8–A19 in block 20A (FIG. 4) is activated, and external access is performed.

Reset signal generator 430 comprises an inverter 431, an AND gate 432, a 3-input OR gate 436, and two pulse generators 434, 438. AND gate 432 is supplied with a BNK signal inverted by inverter 431, and with refresh request signal RFREQ0. First pulse generator 434 generates a pulse at the rising edge of chip select signal #CS. The 3-input OR gate 436 has as inputs the output signal of AND gate 432, the RAT signal, and the output signal of first pulse generator 434. The output of OR gate 436 is given to the second pulse generator 438.

Reset signal generator 430 supplies a pulse signal Q430 to the reset terminal R of RS latch 410 in the following three instances: (1) there is no external access request, but there is a refresh request, for first block 20A; (2) row address A8–A19 has changed; or (3) chip select signal #CS has gone to H level (inactive). In response to pulse signal Q430, RS latch 410 and inverter 411 set the external access signal #EX0 to inactive (H level).

Figure 8:
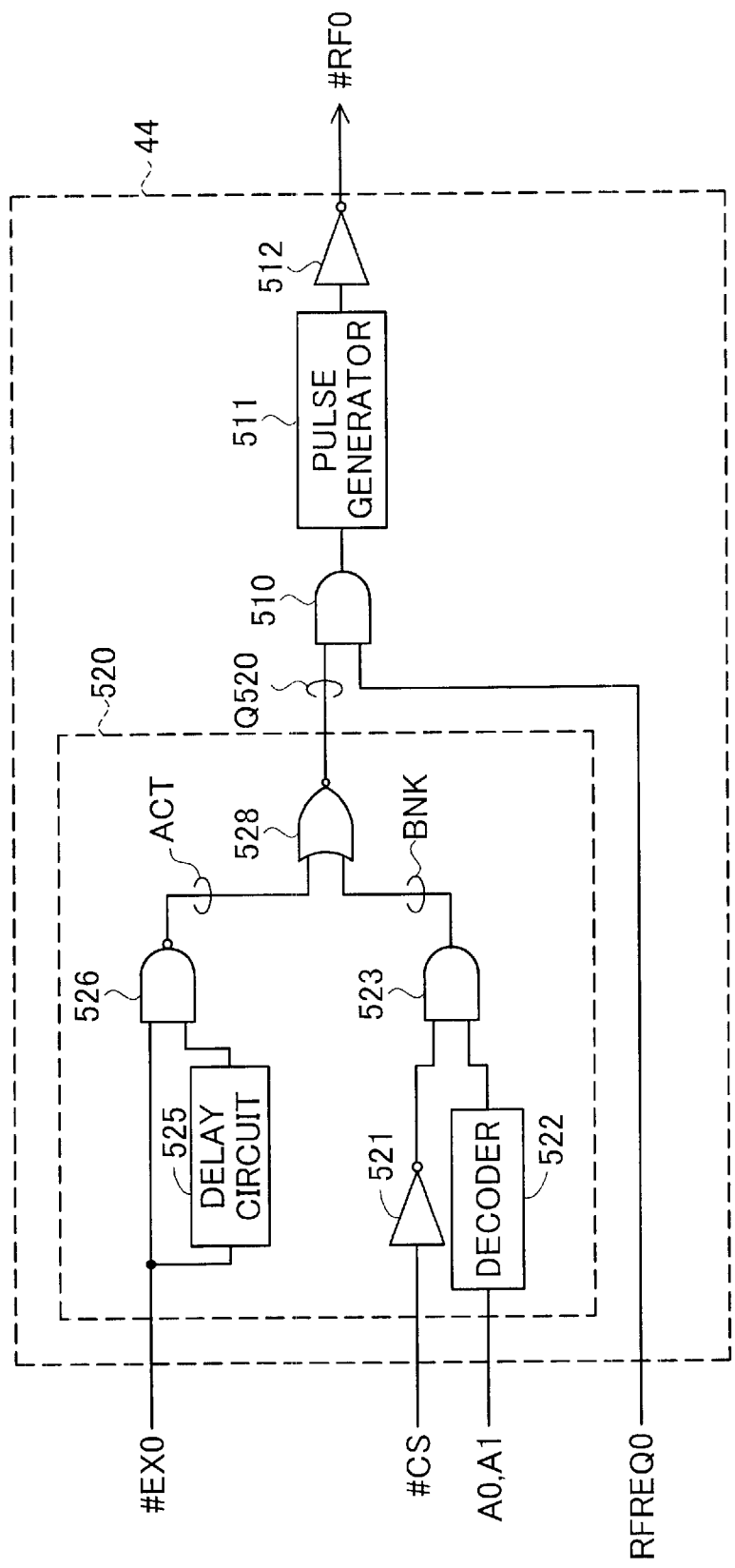
FIG. 8 is a block diagram showing the internal arrangement of the refresh signal generator 44 of FIG. 5.

FIG. 8 is a block diagram showing the internal arrangement of the refresh signal generator 44 of FIG. 5. Refresh signal generator 44 comprises an AND gate 510, a pulse generator 511, an inverter 512, and a refresh request signal controller 520 for controlling output of refresh request signal RFREQ0.

AND gate 510 is supplied with refresh request signal RFREQ0 and with a control signal Q520 from controller 520. When control signal Q520 goes to H level, AND gate 510 can transmit refresh request signal RFREQ0 to pulse generator 511. In response to a rising edge of the output signal from AND gate 510, pulse generator 511 generates a pulse of predetermined width. The generated pulse is inverted by inverter 512 and output as refresh signal #RF0.

Controller 520 comprises an inverter 521, a decoder 522, an AND gate 523, a delay circuit 525, a NAND gate 526, and a NOR gate 528. Similar to the first AND gate 423 in FIG. 7, AND gate 523 outputs a BNK signal. Similar to the second AND gate 426 in FIG. 7, NAND gate 526 outputs an ACT signal whose H level period is extended by a predetermined delay period Tdl (described later) with respect to the L level (active) period of external access signal #EX0. The BNK and ACT signals are given to NOR gate 528.

Controller 520 determines whether there is a request for external access to the first block 20A associated with first block controller 40A, and if there is no request for external access, it supplies an H level control signal Q520 to AND gate 510. At this time, if there is a refresh request, refresh signal #RF0 is set to active (L level); if there is no refresh request, it is set to inactive (H level). However, during a period in which external access signal #EX0 is active (L level) and the subsequent predetermined period Tdl, even if there is no request for the external access, controller 520 supplies an L level control signal Q520 to AND gate 510 and prevents refresh signal #RF0 from being set to L level (active). In this case, after the control signal has gone to H level, refresh signal #RF0 is set to active (L level).

If there is a request for external access to the first block 20A, controller 520 supplies an L level control signal Q520 to AND gate 510. In this case, refresh signal #RF0 is set to inactive (H level) even if there is a refresh request. Refresh signal #RF0 is subsequently held inactive (at H level) until external access of block 20A is completed, and after external access is completed, it is set to active (L level).

When refresh signal #RF0 goes active (to L level), a refresh operation is initiated. Specifically, the word line selected by refresh address RFA8–RFA19 in block 20A (FIG. 4) is activated, and all of the memory cells on the word line are refreshed.

The reset signal generator 46 of FIG. 5 issues a short-pulse reset signal RST0 in response to a rising edge of refresh signal #RF0. This reset signal generator 46 is composed of a one–shot multivibrator, for example. As noted, a reset signal RST0 is supplied to refresh request signal generator 50A, thereby canceling the refresh request for block 20A.

Refresh signals #RF0 and external access signals #EX0 output by block controller 40A (FIG. 5) are supplied to row predecoder 30A (FIG. 4) in block 20A.

Figure 9:
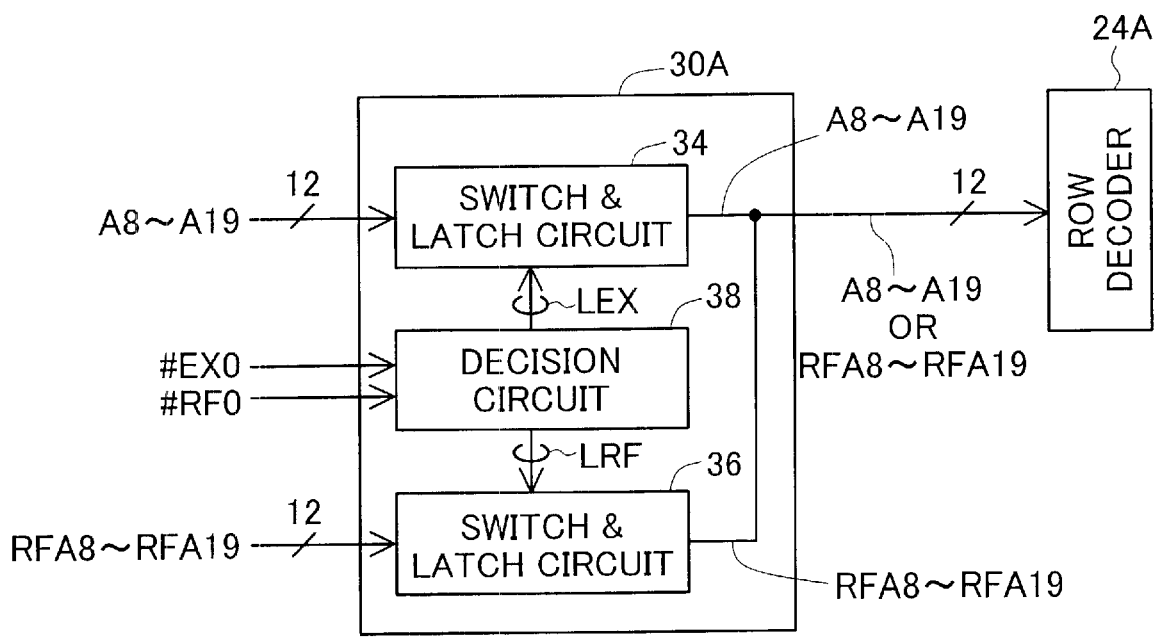
FIG. 9 is a block diagram showing the internal arrangement of the first row predecoder 30A of FIG. 4.

FIG. 9 is a block diagram showing the internal arrangement of the first row predecoder 30A of FIG. 4. Row predecoder 30A comprises two switch & latch circuits 34, 36 and a decision circuit 38. The other row predecoders 30B–30D have the same arrangement as in FIG. 9.

Decision circuit 38 is supplied with external access signal #EX0 and refresh signal #RF0 from block controller 40A. In response to external access signal #EX0, decision circuit 38 supplies a control signal LEX to first switch & latch circuit 34, and in response to refresh signal #RF0 it supplies a control signal LRF to second switch & latch circuit 36.

When external access signal #EX0 is active (L level), first switch & latch circuit 34, in response to control signal LEX, latches the row address A8–A19 supplied to it by the external device and supplies this to row decoder 24A in first block 20A. During this time output by the second switch & latch circuit 36 is disabled by latch signal LRF.

On the other hand, when refresh signal #RF0 is active (L level), second switch & latch circuit 36, in response to control signal LRF, latches the refresh address RFA8–RFA19 supplied to it by refresh counter 100 (FIG. 4) and supplies this to row decoder 24A. During this time output by first switch & latch circuit 34 is disabled by latch signal LEX.

Block controller 40A (FIG. 5) is designed such that the two signals #EX0, #RF0 are never active (L level) at the same time. When both signals #EX0, #RF0 are inactive (H level), row predecoder 30A does not supply addresses A8–A19, RFA8–RFA19 to row decoder 24A.

In this way, in response to the levels of the two signals #EX0, #RF0, row predecoder 30A selects either row address A8–A19 or refresh address RFA8–RFA19, and supplies it to row decoder 24A in block 20A (FIG. 4). When row decoder 24A is supplied with a row address A8–A19 or refresh address RFA8–RFA19 by predecoder 30A, it activates the one word line selected by the row address A8–A19 or the refresh address RFA8–RFA19 in block 20A.

D. Operation of Word Line Activation Controller

D1. Operation During Operation Cycle (with no Refresh Request)

FIGS. 10(a)–10(p) are timing charts showing operation of the word line activation controller in relation to first block 20A during operation cycles. During operation cycles chip select signal #CS (FIG. 10(a)) is L level (active) and snooze signal ZZ (FIG. 10(b)) is H level. In FIGS. 10(a)–10(p), there are six consecutive operation cycles initiated at times t1–t6.

FIGS. 10(a)–10(p) show operation in the absence of a refresh request during operation cycles, namely, in the absence of a rising edge in the refresh timing signal RFTM (FIG. 10(e)) given to the refresh request signal generator 50A of FIG. 5. Here, the refresh request signal REFEQ0 (FIG. 10(f)) given to first block controller 40A remains at L level. Accordingly, the refresh signal #RF0 (FIG. 10(m)) output from refresh signal generator 44 remains at H level (inactive), and the RFC signal (FIG. 10(n)) generated in external access signal generator 42 remains at H level. The reset signal RST0 (FIG. 10(o)) output by reset signal generator 46 remains at L level.

In first, third and fifth cycles beginning at times t1, t3 and t5, respectively, the value of block address A0–A1 (FIG. 10(c)) is "0" and there is request for external access to first block 20A. Similarly, in second, fourth and sixth cycles beginning at times t2, t4 and t6, respectively, the value of block address A0–A1 is "1" and there is request for external access to second block 20B. In the first, third and fifth cycles, the BNK signal (FIG. 10(g)) generated in first block controller 40A is set to H level.

In four (first through fourth) consecutive cycles the value of row address A8–A19 (FIG. 10(d)) is "p", and in two (fifth and sixth) consecutive cycles the value of row address A8–A19 is "q".

Word line WL status in subarray 22A (FIG. 4) of block 20A is shown in FIG. 10(p). Subarray 22A includes a plurality of word lines, but in no instance is more than one word line activated simultaneously. Thus, in FIG. 10(p) word lines activated in sequence in subarray 22A are shown on the same timing chart. Word lines WLp, WLq rising to H level indicate the respective activated word lines.

In the first cycle, since there is a request for external access to first block 20A, the set signal generator 420 of FIG. 7 outputs a pulse signal Q420 (FIG. 10(h)) at time t1. In response to pulse signal Q420, RS latch 410 and inverter 411 set external access signal #EX0 (FIG. 10(j)) to L level (active). When external access signal #EX0 goes to L level (active), the first row predecoder 30A of FIG. 9 selects the row address A8–A19 and supplies it to the first row decoder 24A. Accordingly, in subarray 22A in first block 20A, the "p"th word line WLp selected by row address A8–A19 is activated. Then, in the first cycle, the memory cell selected on the activated word line WLp by row address A8–A19 is externally accessed.

In the second cycle there is no request for external access to first block 20A. However, the reset signal generator 430 of FIG. 7 does not output a pulse signal Q430. Thus, external access signal #EX0 is held at L level (active). At this time the "p"th word line WLp in subarray 22A remains activated. Since there is no request for external access to first block 20A in the second cycle, no external access of memory cells in subarray 22A is performed.

In the third cycle, there is a request for external access to first block 20A, and therefore, as in the first cycle, a pulse signal Q420 is output. However, as external access signal #EX0 has already gone to L level (active), it remains held at L level. The "p"th word line WLp in subarray 22A remains activated, and external access is performed on memory cells on word line WLp.

Since pulse signal Q420 issued during the third cycle does not affect external access signal #EX0, the ACT signal of FIG. 8, for example, could be used to prevent it from being issued.

In the fourth cycle, since there is no request for external access to first block 20A, external access signal #EX0 remains held at L level (active) as in the second cycle. The "p"th word line WLp in subarray 22A remains activated, but no external access is performed on memory cells in subarray 22A.

In the fifth cycle, the value of row address A8–A19 changes from "q" to "r". The RATD circuit 130 of FIG. 5 detects the change in row address at time t5 and outputs a RAT signal. In response to the RAT signal, the reset signal generator 430 of FIG. 7 outputs a pulse signal Q430 (FIG. 10(i)). In response to pulse signal Q430, RS latch 410 and inverter 411 set the external access signal #EX0 to H level (inactive). At this time, the "p"th word line WLp in subarray 22A is deactivated.

In the fifth cycle, there is a request for external access to first block 20A. Accordingly, as in the first and third cycles, a pulse signal Q420 is output, and external access signal #EX0 is again set to L level (active). The "q"th word line WLq selected in subarray 22A by row address A8–A19 is activated, and external access is performed on memory cells on word line WLq.

In the sixth cycle, since there is no request for external access to first block 20A, external access signal #EX0 remains held at L level (active), as in the second and fourth cycles. The "q"th word line WLq in subarray 22A remains activated, but no external access is performed on memory cells in subarray 22A.

At time t7 the chip select signal #CS rises to H level (inactive). At this point the reset signal generator 430 of FIG. 7 outputs a pulse signal Q430. In response thereto, external access signal #EX0 is set to H level (inactive), and the "q"th word line WLq in subarray 22A is deactivated.

Figure 10:
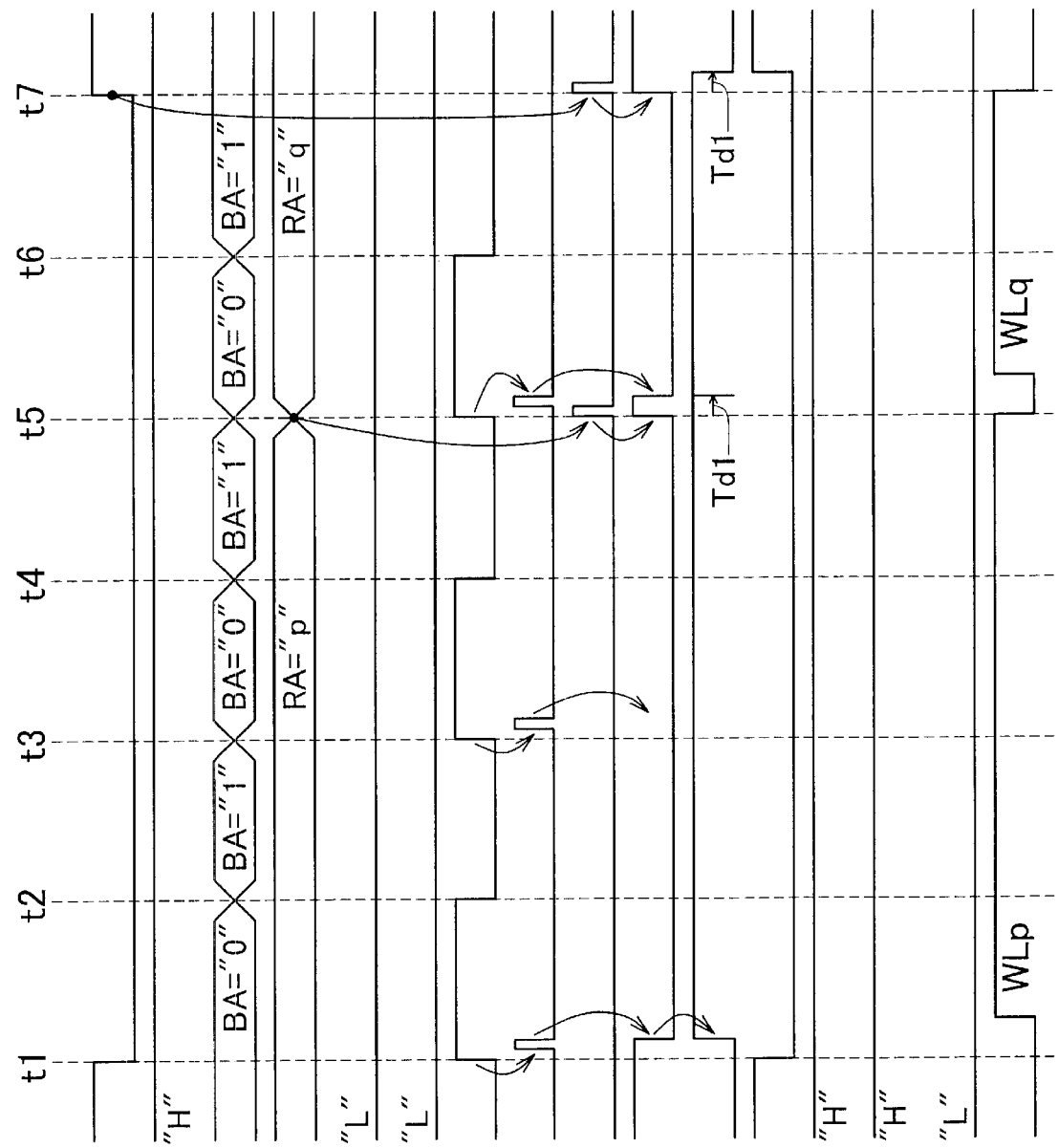
FIGS. 10(a)–10(p) are timing charts showing operation of the word line activation controller in relation to first block 20A during operation cycles.

As indicated in FIG. 10(*k*), the ACT signal generated in the refresh signal generator 44 of FIG. 8 has an H level period that is extended by a predetermined period Td1 with respect to the L level period of external access signal #EX0. Around time t5, ACT signal goes to L level for a brief period, since the H level period of external access signal #EX0 is slightly longer than the predetermined period Td1. As indicated in FIG. 10(1), control signal Q520 is at L level during the BNK signal H level period and the ACT signal H level period. However, in FIGS. 10(*a*)–10(*p*), since the refresh request signal RFREQ0 is L level, the levels of the BNK and ACT signals don't affect the level of refresh signal #RF0.

Figure 11:
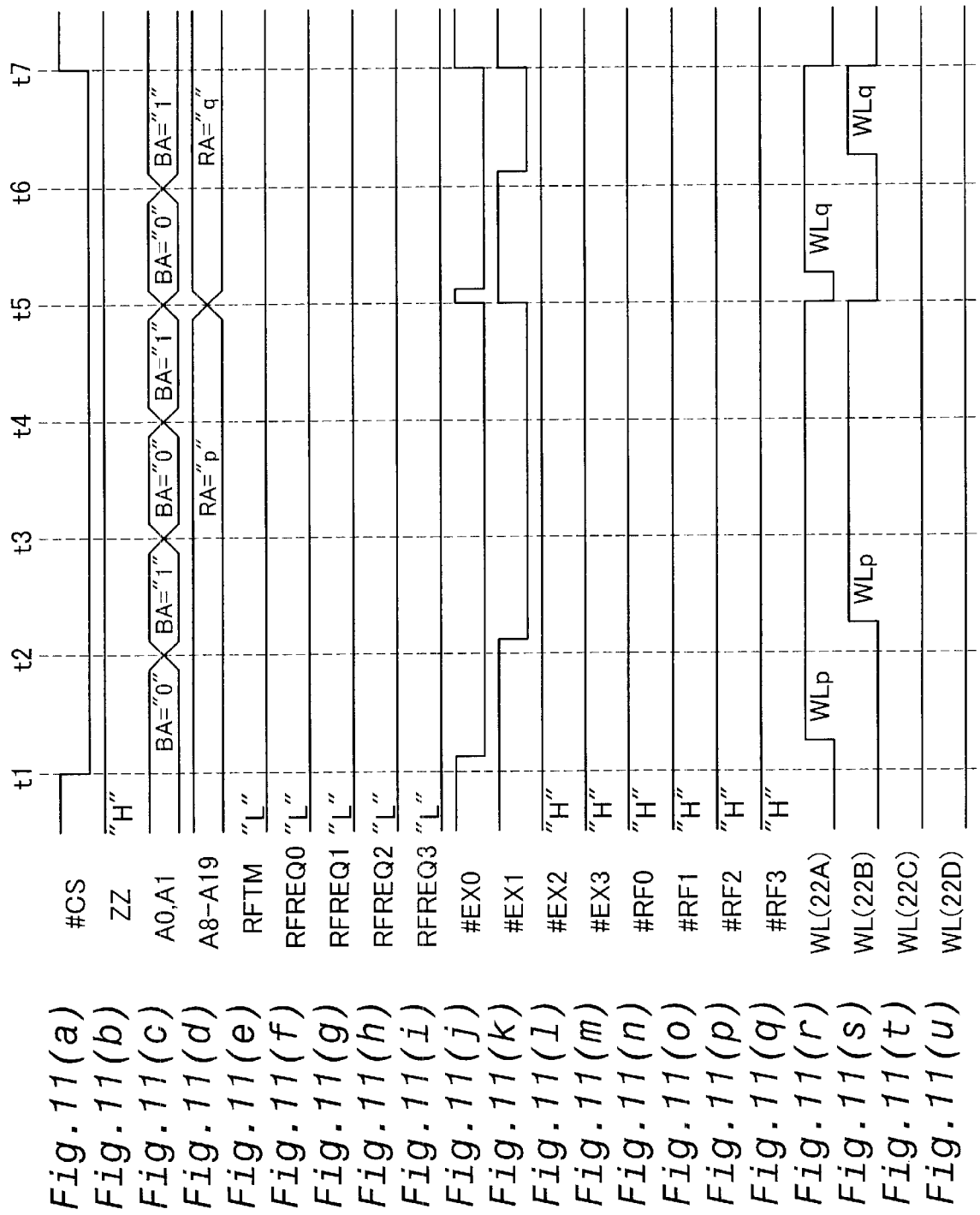
FIGS. 11(a)–11(u) are timing charts showing operation of the word line activation controller in relation to blocks 20A–20D during the operation cycles shown in FIGS. 10(a)–10(p)

FIGS. 11(*a*)–11(*u*) are timing charts showing operation of the word line activation controller in relation to blocks 20A–20D during the operation cycles shown in FIGS. 10(*a*)–10(*p*). FIGS. 11(*a*)–11(*d*) are analogous to FIGS. 10(*a*)–10(*d*). Since the absence of a refresh request is assumed, the refresh timing signal RFTM (FIG. 11(*e*)) is the same as in FIG. 10(*e*). Accordingly, the refresh request signals REFEQ0–REFEQ3 (FIGS. 11(*f*)–11(*i*)) given to block controllers 40A–40D and the refresh signals #RF0–#RF3 (FIGS. 11(*n*)–11(*p*)) output by block controllers 40A–40D have the same signal levels as those in FIGS. 10(*f*) and 10(*m*), respectively.

FIGS. 11(*j*)–11(*m*) show the external access signals #EX0–#EX3 output by block controllers 40A–40D. FIG. 11(*j*) is the same as FIG. 10(*j*)). FIGS. 11(*r*)–11(*u*) show the status of word lines in subarrays 22A–22D of blocks 20A–20D. FIG. 11(*r*) is the same as FIG. 10(*p*).

In the second cycle, there is a request for external access to second block 20B. Accordingly, the second block controller 40B sets the external access signal #EX1 (FIG. 11(*k*)) to L level (active). At this time, in the second subarray 22B the "p"th word line WLp selected by row address A8–A19 is activated.

Since the value "p" of the row address A8–A19 used in the second cycle remains unchanged at "p" up to time t5, the second block controller 40B holds external access signal #EX1 at L level (active) over three (the second through fourth) consecutive cycles. During this time, in the second subarray 22B the "p"th word line WLp remains activated.

In the sixth cycle, as in the second cycle, there is a request for external access to second block 20B, and thus external access signal #EX1 is set to L level (active). In second subarray 22B the "q"th word line WLq is activated.

If there is a request for external access to third block 20C during the third cycle in FIGS. 11(*a*)–11(*u*), third external access signal #EX3 is also set to L level (active), and is held at L level (active) until there is a change in row address A8–A19. In this case, the "p"th word line in the third subarray 22C is activated.

As described hereinabove with reference to FIGS. 10(*a*)–10(*p*) and 11(*a*)–11(*u*), where there is a request for external access to a certain block, block controllers 40A–40D set the external access signal for the block to active. At this time, the word line selected in the block by the row address is activated, and external access is performed on memory cells on the activated word line. Once an external access signal has been set to active (L level), block controllers 40A–40D hold it at L level until there is a change in the row address A8–A19 of the address A0–A19 used in a subsequent cycle. During this time the word line is held in the activated state, and in a cycle in which external access to the block is again requested, external access is performed on memory cells on the previously activated word line. This obviates the need to repeatedly activate and deactivate word lines during each cycle, thus considerably reducing power consumption.

In this way, in the event of consecutive operation cycles employing addresses that contain the same row address, the word line activation controller in the present embodiment can maintain in the activated state a word line in a first memory cell block activated during the initial cycle, without deactivating it until the final cycle.

At the same time, the word line activation controller can maintain in the activated state a word line in a second memory cell block activated in a cycle coming after the initial cycle and up through the final cycle, without deactivating it until the final cycle. Where word lines in two or more blocks are held in the activated state at the same time, the frequency of external access of memory cells on the activated word lines can be increased, thereby considerably reducing the power consumption associated with activation of word lines.

In the present embodiment the row address is assigned to the uppermost plurality of bits of a 20-bit address, so the row address is relatively less likely to change. In this way the frequency with which word lines can be held in the activate state can be increased, thereby further reducing the power consumption associated with activation of word lines.

D2. Operation During Operation Cycle (with a Refresh Request)

Figure 12:
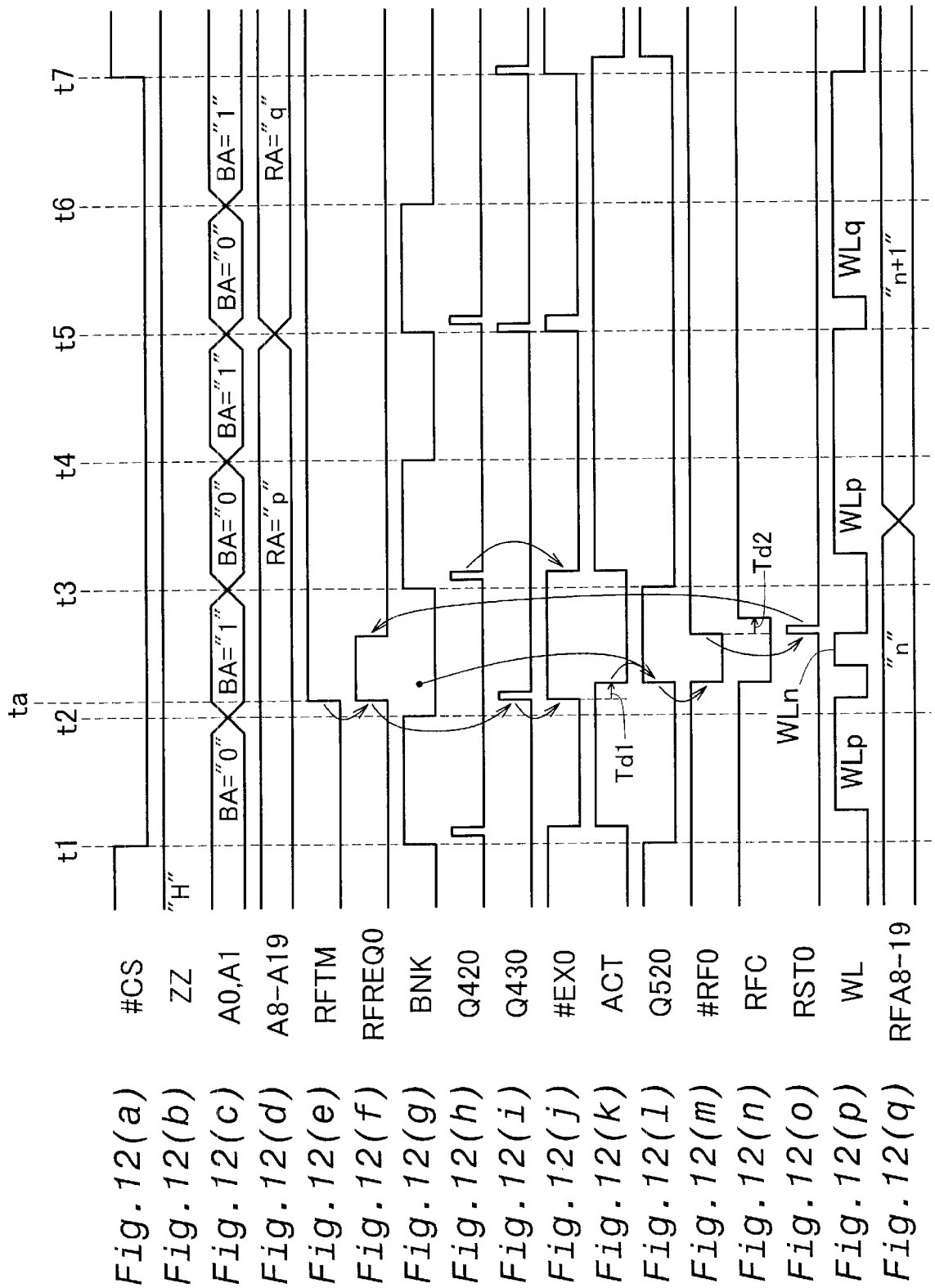
FIGS. 12(a)–12(q) are timing charts showing operation of the word line activation controller in relation to first block 20A during an operation cycle in which there is a refresh request.

FIGS. 12(*a*)–12(*q*) are timing charts showing operation of the word line activation controller in relation to first block 20A during an operation cycle in which there is a refresh request. FIGS. 12(*a*)–12(*d*) and 12(*g*) are analogous to FIGS. 10(*a*)–10(*d*) and 10(*g*).

As shown in FIG. 12(*e*), at time ta during the second cycle period, refresh timing signal RFTM rises to H level. At this time refresh request signal generator 50A (FIG. 5) immediately sets the refresh request signal RFREQ0 (FIG. 12(*f*)) to H level, to request a refresh operation on first block 20A. Refresh request signal RFREQ0 is held at H level until the refresh operation in the first block 20A is completed.

In the second cycle, as there is no request for external access to first block 20A, when refresh request signal RFREQ0 is set to H level the reset signal generator 430 of FIG. 7 outputs a pulse signal Q430 (FIG. 12(*i*)). At this time external access signal #EX0 is set to H level (inactive), and the "p"th word line WLp in subarray 22A is deactivated. Since there is no request for external access to first block 20A, deactivation of word line WLp during the second cycle is possible.

When external access signal #EX0 rises to H level, the ACT signal (FIG. 12(*k*)) subsequently goes to L level after a predetermined period Td1 has elapsed. In the second cycle, the BNK signal (FIG. 12(g)) goes to L level. Accordingly, the controller 520 of FIG. 8 sets control signal Q520 (FIG. 12(l)) to H level. As a result, refresh signal generator 44—in response to refresh request signal RFREQ0—outputs a refresh signal #RF0 (FIG. 12(m)) having a predetermined L level (active) period.

When refresh signal #RF0 is set to L level (active), the first row predecoder 30A of FIG. 9 selects refresh address RFA8–RFA19 and supplies it to first row decoder 24A. Thus, in subarray 22A of the first block 20A the "n"th word line selected by refresh address RFA8–RFA19 (FIG. 12(q)) is activated, and a refresh operation is performed on all memory cells on the word line.

When refresh signal #RF0 returns to H level (inactive),the "n"th word line WLn in subarray 22A is deactivated. In response to the rising edge of refresh signal #RF0, the reset signal generator 46 of FIG. 5 issues a shortpulse reset signal RST0 (FIG. 12(o)). In response to reset signal RST0, refresh request signal generator 50A (FIG. 5) returns refresh request signal RFREQ0 to L level. This completes the refresh operation in the first block.

When refresh signal #RF0 returns to H level, the RFC signal (FIG. 12(n))—which has been set to L level in response to refresh signal #RF0—now returns to H level, after a predetermined period Td2 has elapsed.

In the third cycle, there is a request for external access to the first block 20A, and the RFC signal is at H level. Accordingly, the set signal generator 420 of FIG. 7 outputs a pulse signal Q420, and in response thereto external access signal #EX0 is set to L level (active). In subarray 22A the "p"th word line WLp is again activated for external access.

FIGS. 13(a)–13(w) are timing charts showing operation of the word line activation controller in relation to blocks 20A–20D during the operation cycles shown in FIGS. 12(a)–12(q). FIGS. 13(a)–13(d) are analogous to FIGS. 12(a)–12(d). The refresh timing signal RFTM in FIG. 13(e) is analogous to that in FIG. 12(e), and operation in relation to the first block 20A is the same as in FIGS. 12(a)–12(q).

When the refresh timing signal RFTM rises to H level at time ta, all of the refresh request signals RFREQ0–RFREQ3 (FIGS. 13(f)–13(i)) are immediately set to H level to request refresh operations for blocks 20A–20D.

As regards the second block 20B, since there is a request for external access at time t2—coming prior to time ta—, external access is performed during the second cycle. Refresh request signal RFREQ1 continues to be held at H level. In the third cycle, there is no request for external access to second block 20B, but there is a refresh request, so external access signal #EX1 (FIG. 13(k)) is set to H level (inactive). At this point the "p"th word line WLp (FIG. 13(s)) in second subarray 22B is deactivated. After external access signal #EX1 rises, refresh signal #RF1 (FIG. 13(o)) is set to L level (active). Accordingly, the "n"th word line WLn in second subarray 22B is activated and a refresh operation is performed. When refresh signal #RF1 is subsequently set to H level (inactive), refresh request signal RFREQ1 returns to L level. In the fourth cycle, since there is a request for external access to the second block 20B, external access signal #EX1 is again set to L level (active), and the "p"th word line WLp in subarray 22B is again activated.

As regards the third block 20C, since there is no request for external access during the second cycle, external access signal #EX2 (FIG. 13(l)) is H level (inactive). Thus, when refresh request signal RFREQ2 goes to H level, refresh signal #RF2 (FIG. 13(p)) is immediately set to L level. Accordingly, the "n"th word line WLn (FIG. 13(t)) in third subarray 22C is activated and a refresh operation is performed. When refresh signal #RF2 is subsequently set to H level (inactive), refresh request signal RFREQ2 returns to L level.

Operation for the fourth block 20D is analogous to that for the third block 20C.

By the way, refresh operations in each block 20A–20D are performed according to the same given refresh address RFA8–RFA19 (FIG. 13(w)).

That is, when refresh address RFA8–RFA19 assumes a value of "n", the "n"th word line WLn in each block 20A–20D is activated, and all memory cells on word line WLn are refreshed.

When refresh operations on each block 20A–20D are completed, refresh request signals RFREQ0–RFREQ3 (FIGS. 13(f)–13(i)) return to L level. When all refresh request signals RFREQ0–RFREQ3 have returned to L level, the refresh counter controller 90 in FIG. 4 issues a countup signal #CNTUP (FIG. 13(v)).

Figure 13:
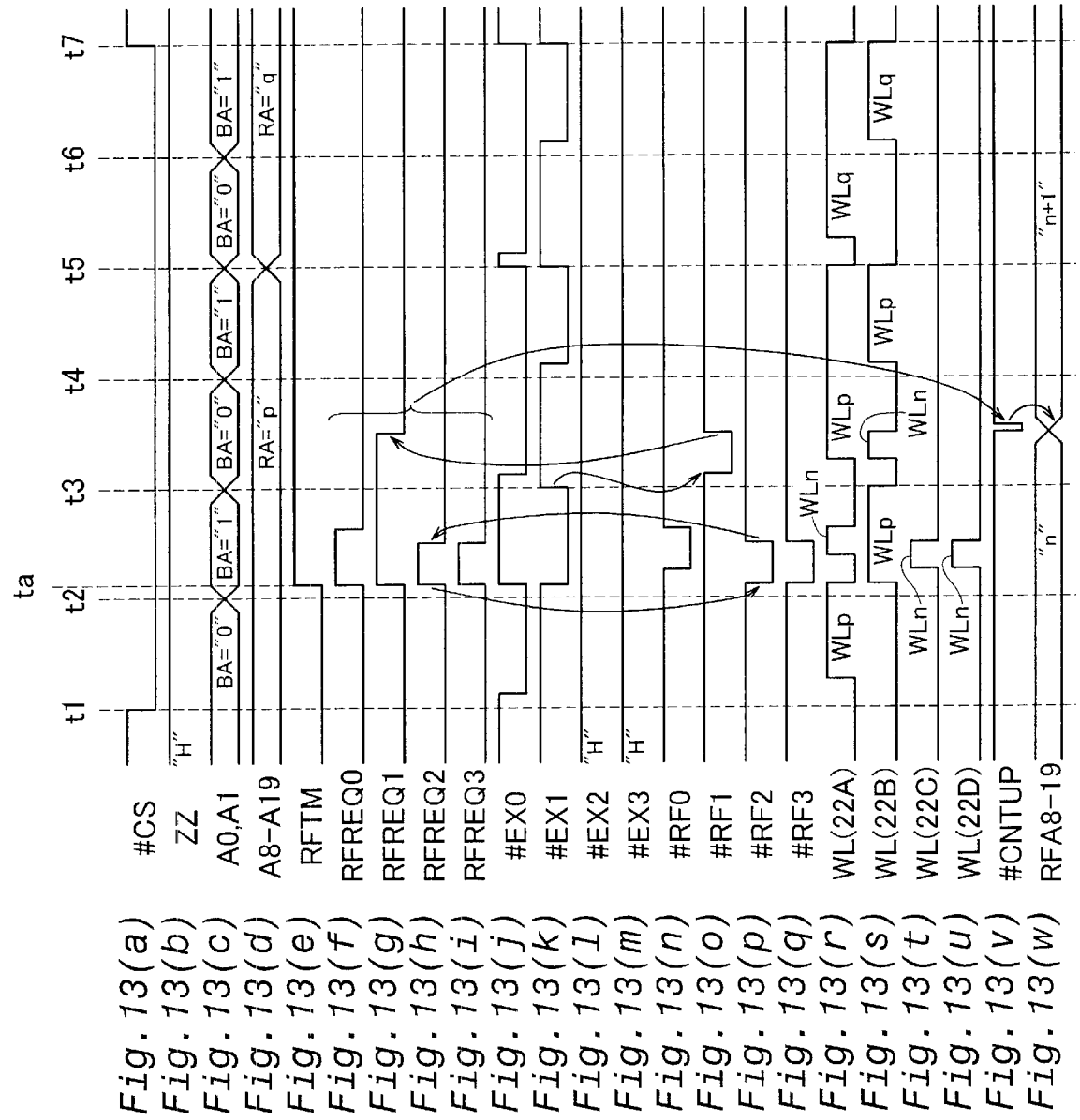
FIGS. 13(a)–13(w) are timing charts showing operation of the word line activation controller in relation to blocks 20A–20D during the operation cycles shown in FIGS. 12(a)–12(q)
Figure 14:
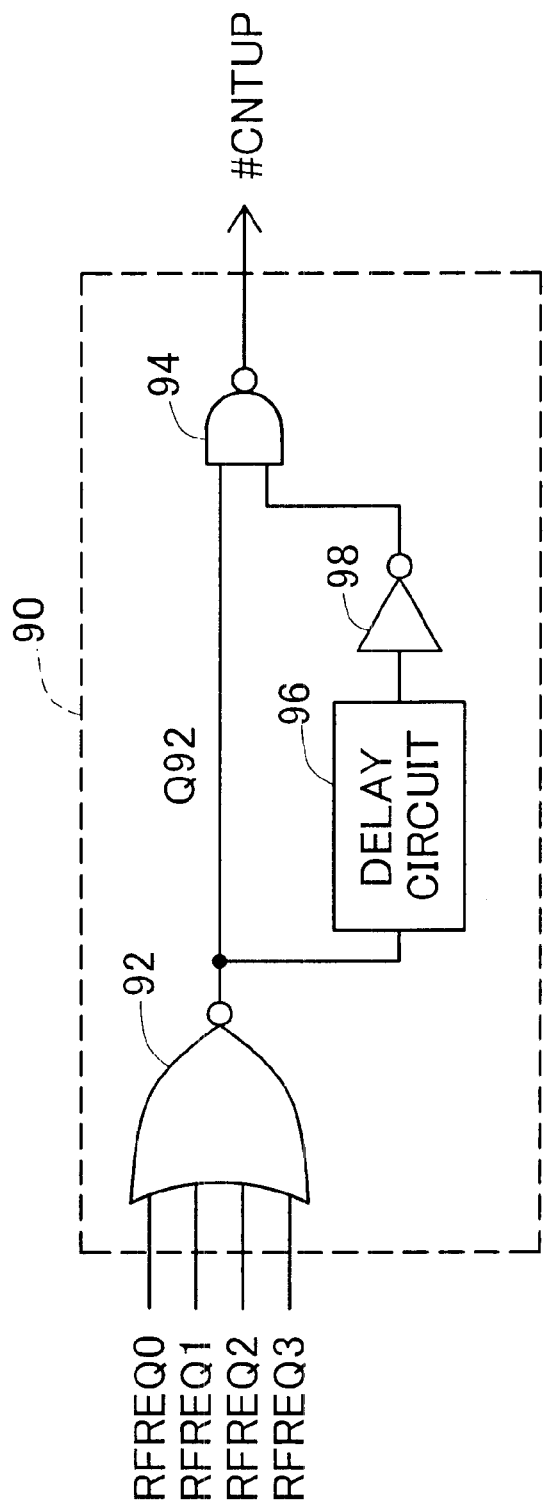
FIG. 14 is a block diagram showing the internal arrangement of the refresh counter controller 90 of FIG. 4.

FIG. 14 is a block diagram showing the internal arrangement of the refresh counter controller 90 of FIG. 4. Refresh counter controller 90 comprises a 4-input NOR gate 92, a NAND gate 94, a delay circuit 96, and an inverter 98. The 4-input NOR gate 92 has as inputs the four refresh request signals RFREQ0–RFREQ3. The output Q92 of the 4-input NOR gate 92 is given to one of the input terminals of the NAND gate 94. Output Q92 is also given to the other terminal of the NAND gate 94, after being delayed by the delay circuit 96 and inverted by the inverter 98. As will be apparent from this arrangement, the countup signal #CNTUP output from NAND gate 94 is a pulse signal (FIG. 13(v)) that is set to L level after the four refresh request signals RFREQ1–RFREQ3 all drop to L level, during a delay period produced by delay circuit 96.

In response to countup signal #CNTUP, refresh counter 100 (FIG. 4) increments by 1 the refresh address RFA8–RFA19 (FIG. 13(w)). Accordingly, the next refresh operation is performed on the "n+1"th word line.

As described hereinabove with reference to FIGS. 12(a)–12(q) and 13(a)–13(w), where there is a refresh request, block controllers 40A–40D set the refresh signals for the other blocks—i.e. those other than the one block to which external access is requested—to active. In these other blocks, word lines held in the activated state are now deactivated for the refresh operation. The word lines selected by the refresh address are then activated and the refresh operation is performed.

As regards the one block being externally accessed, once there is no longer a request for external access to the block, the refresh signal for this block is set to active. The activated word line in the one block is now deactivated. The word line selected by the refresh address is then activated, and the refresh operation is performed.

In this way, when consecutive operation cycles use addresses including the same given row address, the word line activation controller in the present embodiment is capable of maintaining in the activated state a word line activated in a first memory cell block during the initial cycle, without deactivating it until the final cycle. Where a word line in a first memory cell block has been activated and there is a refresh request for the first memory cell block, the word line activation controller can deactivate the activated word line in the first memory cell block, with the proviso that no external access operations are currently being performed in the first memory cell block. In this way, refresh operations can be performed in a semiconductor memory device, while also obviating the need to repeatedly activate and deactivate word lines in each cycle during periods in which no refresh operations are being performed, thereby reducing the power consumption associated with word line activation.

At the same time, the word line activation controller can hold in the activated state a word line activated in a second memory cell block in any cycle coming after the initial cycle and up through the final cycle, without deactivating it until the final cycle. When there is a refresh request to the second memory cell block in addition to the first memory cell block, the word line activation controller can deactivate the word line in the second memory cell block, with the proviso that no external access operations are currently being performed in the second memory cell block.

In this way, the word line activation controller can hold word lines in two or more blocks are held in the activated state at the same time, and when there is a refresh request, can deactivate the activated word lines without waiting for the final cycle, and perform the refresh operation.

By the way, in FIGS. 12(a)–12(q), a refresh request is issued at time ta, considerably prior to time t3 at which the external access request to the first block 20A is issued. Therefore, the refresh operation can be performed in the second cycle, and external access in the third cycle. However, if there is a refresh request just prior to time t3—in other words, if there is a refresh request within a predetermined, relatively brief period preceding time t3—the refresh operation is delayed, and external access is given precedence in the third cycle. This is possible through the use of the ACT signal, described hereinbelow.

FIGS. 15(a)–15(q) are timing charts showing operation of the word line activation controller in relation to first block 20A in the event of a refresh request occurring at a different time than in FIGS. 12(a)–12(q). In FIGS. 15(a)–15(q), refresh timing signal RFTM rises to H level at time tb, lying within a predetermined period prior to completion of the second cycle. FIGS. 15(a)–15(d) and 15(g) are analogous to FIGS. 10(a)–10(d) and 10(g).

As shown in FIGS. 15(e) and 15(f), refresh timing signal RFTM rises to H level at time tb, whereupon the refresh request signal RFREQ0 is immediately set to H level to request a refresh operation on first block 20A.

In the second cycle, as there is no request for external access to first block 20A, when refresh request signal RFREQ0 is set to H level a pulse signal Q430 (FIG. 15(i)) is output. At this time external access signal #EX0 (FIG. 15(j)) is set to H level (inactive), and the "p"th word line WLp (FIG. 15(q)) in subarray 22A is deactivated. This enables a refresh operation.

Once external access signal #EX0 rises to H level, the ACT signal (FIG. 15(k)) goes to L level during the third cycle, after a predetermined period Td1 has elapsed. However, in the third cycle the BNK signal (FIG. 15(g)) is set to H level. Thus, the controller 520 of FIG. 8 holds control signal Q520 (FIG. 15(l)) at L level during the third cycle, as a result of which refresh signal #RF0 (FIG. 15(m)) is not set to L level (active), but rather held at H level (inactive). That is, refresh operations are suspended.

In the third cycle, since there is a request for external access to first block 20A, a pulse signal Q420 (FIG. 15(h)) is output, and in response thereto external access signal #EX0 is set to L level (active). The "p"th word line WLp in subarray 22A is again activated. External access is given priority over the refresh operation.

In the fourth cycle, there is no request for external access to first block 20A, but there is a refresh request, so a pulse signal Q430 is output. In response, external access signal #EX0 is set to H level (inactive). At this time the "p"th word line WLp in subarray 22A is deactivated. Once external access signal #EX0 rises, the ACT signal goes to L level after a predetermined period Td1 has elapsed. In response to which control signal Q520 goes to H level. As a result, refresh signal #RF0 is set to L level (active), and a refresh operation is performed on the activated "n"th word line WLn in subarray 22A.

When refresh signal #RF0 returns to H level (inactive), the "n"th word line WLn in subarray 22A is deactivated. In response to the rising edge of refresh signal #RF0 a short-pulse reset signal RST0 (FIG. 15(o)) is generated, in response to which refresh request signal RFREQ0 returns to L level.

FIGS. 16(a)–16(w) are timing charts showing operation of the word line activation controller in relation to blocks 20A–20D during the operation cycles shown in FIGS. 15(a)–15(q). FIGS. 16(a)–16(d) are analogous to FIGS. 15(a)–15(d). The refresh timing signal RFTM in FIG. 16(e) is analogous to that in FIG. 15(e), and operation in relation to the first block 20A is the same as in FIGS. 15(a)–15(q).

As regards the second block 20B, since there is a request for external access at time t2—coming prior to time tb—, operation is the same as in FIGS. 13(a)–13(w). As regards the third and fourth blocks 20C, 20D, since there is no request for external access, operation is essentially the same as in FIGS. 13(a)–13(w). However, as the refresh timing signal RFTM rises at a different point in time, the timing of the refresh operation is different.

Operation once all of the refresh request signals RFREQ0–RFREQ3 have returned to L level is analogous to that in FIGS. 13(a)–13(w).

As described with reference to FIGS. 15(a)–15(q) and 16(a)–16(w), if a refresh operation for a certain block is requested in the absence of a request for external access, the external access signal for that block is set to inactive (H level), and any previously activated word line is deactivated. Where a refresh operation has been requested within a predetermined period prior to the time of a request for external access to the block, the refresh operation is suspended, the external access signal for the block is again set to active (H level), and the word line is activated. The refresh operation is performed once external access is completed.

In the present embodiment, when a refresh request is issued within a predetermined period prior to the time of a request for external access to the block, external access is given priority, and the refresh operation is delayed until the cycle coming after external access is completed. On the other hand, where a refresh request is issued just prior to a predetermined period prior to the time of a request for external access to the block, it becomes necessary for both refresh and external access operations to be performed within a single cycle. In other words, the period for which both refresh and external access operations are enabled is set to Tcyc, the shortest cycle of change in address A0–A19. As will be described later, this cycle Tcyc is to be shortest in the present embodiment.

FIGS. 17(a)–17(q) are timing charts showing operation in relation to first block 20A in the event of a refresh request occurring at a different time than in FIGS. 15(a)–15(q). In FIGS. 17(a)–17(q), refresh timing signal RFTM rises to H level at time tc, coming just prior to a predetermined period preceding completion of the second cycle. FIGS. 17(a)–17(d) and 17(g) are analogous to FIGS. 10(a)–10(d) and 10(g).

As shown in FIGS. 17(e) and 17(f), refresh timing signal RFTM rises to H level at time tc, whereupon the refresh request signal RFREQ0 is immediately set to H level to request a refresh operation on first block 20A.

Figure 17:
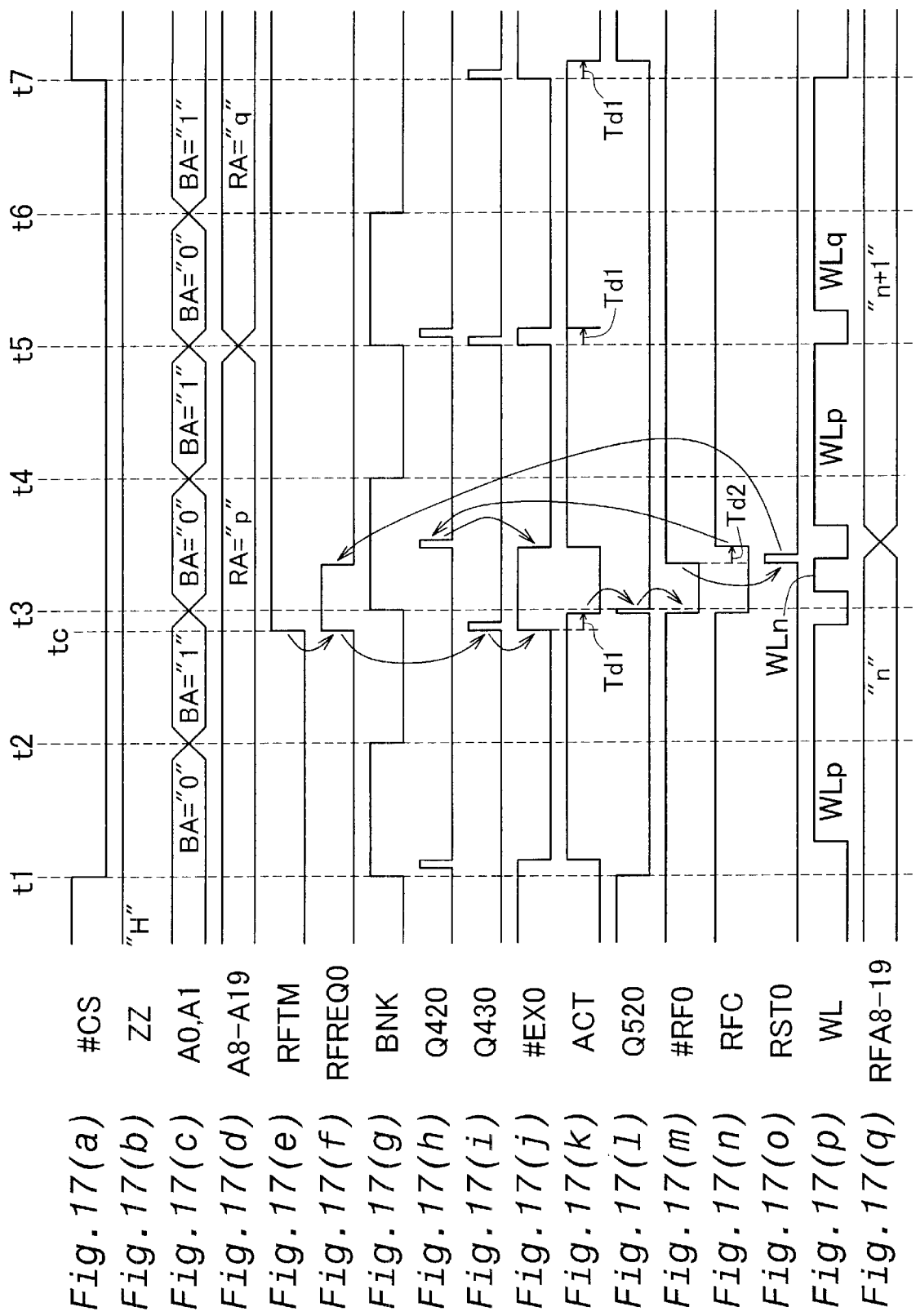
FIGS. 17(a)–17(q) are timing charts showing operation in relation to first block 20A in the event of a refresh request occurring at a different time than in FIGS. 15(a)–15(q)

In the second cycle, as there is no request for external access to first block 20A, when refresh request signal RFREQ0 is set to H level a pulse signal Q430 (FIG. 17(*i*)) is output. At this time external access signal #EX0 (FIG. 17(*j*)) is set to H level (inactive), and the "p"th word line WLp in subarray 22A is deactivated.

Once external access signal #EX0 rises to H level, the ACT signal (FIG. 17(*k*)) goes to L level after a predetermined period Td1 has elapsed just prior to completion of the second cycle. In the second cycle the BNK signal (FIG. 17(*g*)) is L level, so a pulse control signal Q520 (FIG. 17(*l*)) is output just prior to time t3. As a result, refresh signal #RF0 (FIG. 17(*m*)) is set to L level (active), the "n"th word line WLn in subarray 22A is activated, and the refresh operation is performed.

When refresh signal #RF0 returns to H level (inactive), the "n"th word line WLn in subarray 22A is deactivated. In response to the rising edge of refresh signal #RF0 a short-pulse reset signal RST0 (FIG. 17(*o*)) is generated, in response to which refresh request signal RFREQ0 returns to L level.

After a predetermined period Td2 after refresh signal #RF0 has risen to H level, the RFC signal (FIG. 17(*n*))—which had been set to L level in response to refresh signal #RF0—returns to H level.

In the third cycle, since there is a request for external access to first block 20A, when the RFC signal returns to H level a pulse signal Q420 (FIG. 17(*h*)) is output. At this time external access signal #EX0 is set to L level (active), the "p"th word line WLp in subarray 22A is again activated, and external access is performed. In this way, external access is performed after the refresh operation in the third cycle.

Figure 18:
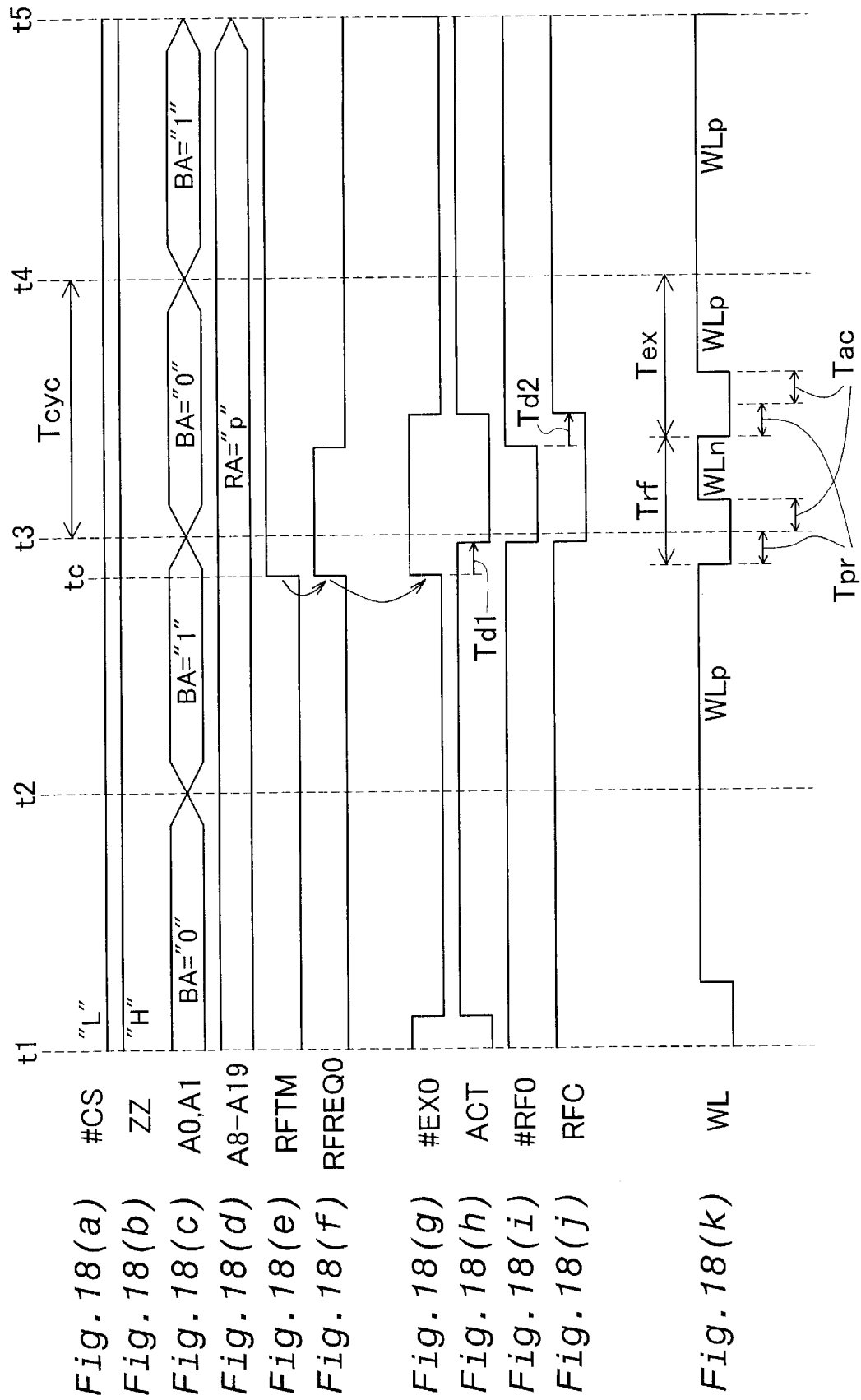
FIGS. 18(a)–18(k) are timing charts showing an enlargement of the first through fourth cycles in FIGS. 17(a)–17(q)

FIGS. 18(*a*)–18(*k*) are timing charts showing an enlargement of the first through fourth cycles in FIGS. 17(*a*)–17(*q*). Only some of the signals in FIGS. 17(*a*)–17(*q*) are shown in FIGS. 18(*a*)–18(*k*).

As shown in FIG. 18(*k*), in order to perform a refresh and an external access operation sequentially, there are required a period Trf of sufficient duration for the refresh operation, and a period Tex of sufficient duration for the external access operation. These periods Trf, Tex include a period Tpr needed for the precharge operation (hereinafter "precharge period") performed by the precharging circuit (not shown) in block 20A, and a period Tac needed during word line activation. Where refresh and external access operations are to be performed sequentially within a single cycle, the shortest cycle of change in address A0–A19, Tcyc, is typically set to (Trf+Tex). In the present embodiment, however, since the ACT and RFC are used, shortest cycle Tcyc can essentially be set to (Trf+Tex−Tpr).

Specifically, the ACT signal has an H level period that is extended by a predetermined period Td1 with respect to the L level (active) period of external access signal #EX0. This predetermined period Td1 is set to essentially the same period as the precharge period Tpr. Thus, when the time at which refresh request signal RFREQ0 goes to H level precedes—by a period equal to predetermined period Td1 or longer—the time t3 at which there is a request for external access to first block 20A, a period Tpr of sufficient duration for the precharge for a refresh operation is assured during the second cycle period. By so doing, the period for the refresh operation to be assured in the third cycle can essentially be set to (Trf−Tpr).

The RFC signal has an L level period that is extended by a predetermined period Td2 with respect to the L level (active) period of refresh signal #RF0. This predetermined period Td2 is set to essentially the same period as the precharge period Tpr. Thus by setting external access signal #EX0 to L level (active) after the RFC signal has gone to H level, it is possible to assure a period Tpr of sufficient duration for the precharge for an external access operation.

In the present embodiment, since the ACT and RFC signals are used, the shortest cycle Tcyc of change in address A0–A19 can essentially be set to (Trf+Tex−Tpr).

Figure 19:
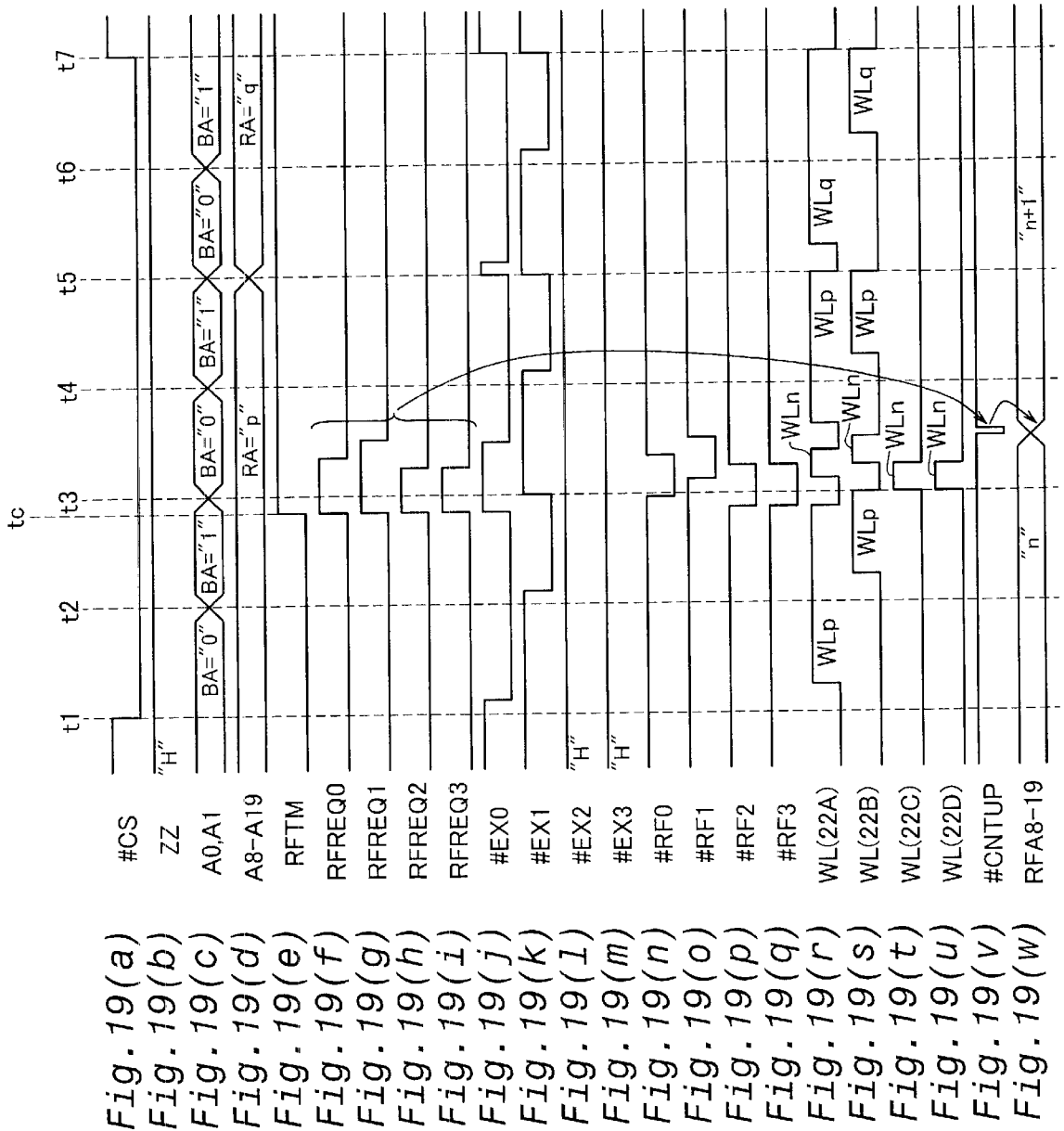
FIGS. 19(a)–19(w) are timing charts showing operation of the word line activation controller in relation to blocks 20A–20D during the operation cycles shown in FIGS. 17(a)–17(q)

FIGS. 19(*a*)–19(*w*) are timing charts showing operation of the word line activation controller in relation to blocks 20A–20D during the operation cycles shown in FIGS. 17(*a*)–17(*q*). FIGS. 19(*a*)–19(*d*) are analogous to FIGS. 17(*a*)–17(*d*). The refresh timing signal RFTM in FIG. 19(*e*) is analogous to that in FIG. 17(*e*), and operation in relation to the first block 20A is the same as in FIGS. 17(*a*)–17(*q*).

Figure 16:
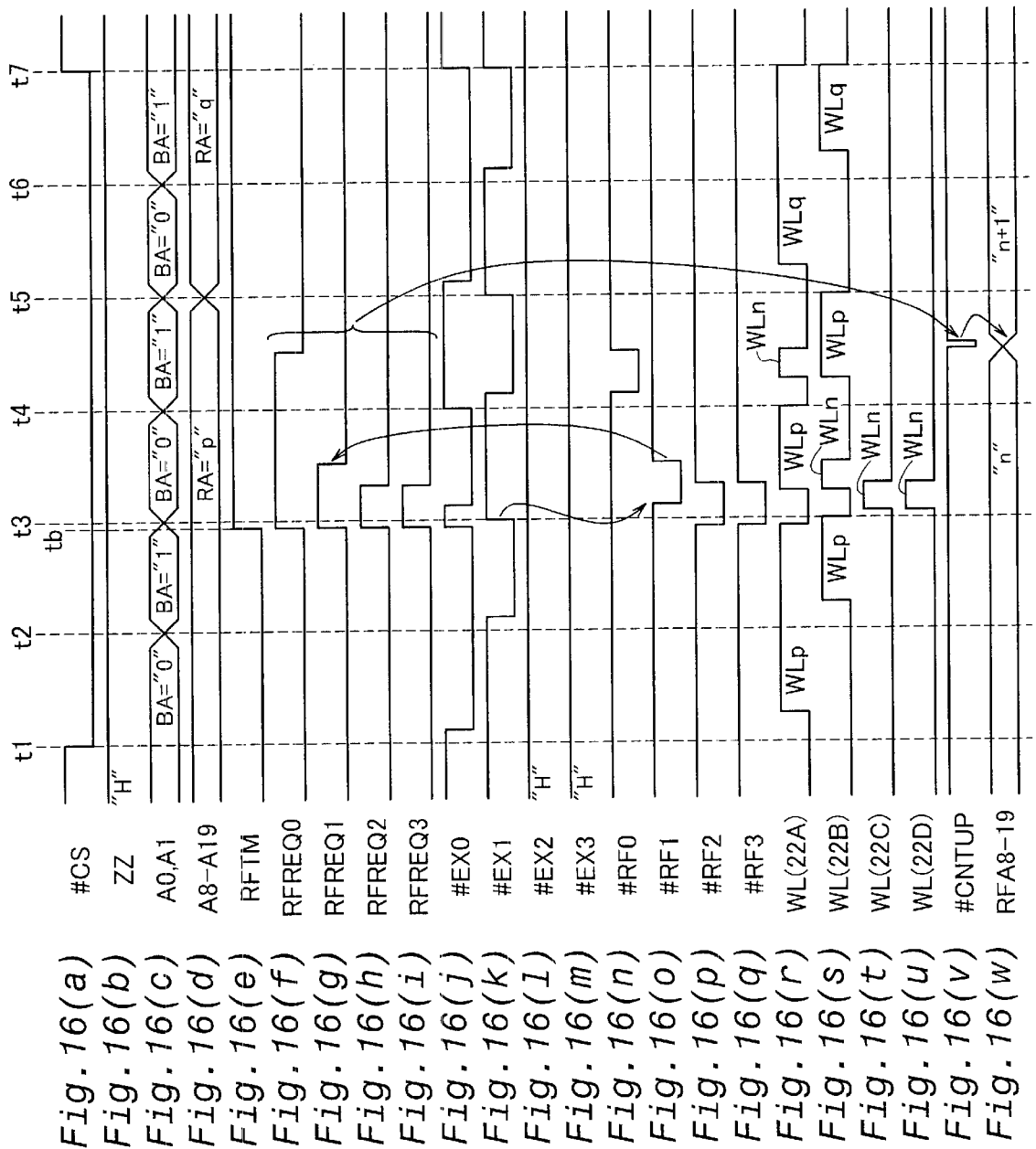
FIGS. 16(a)–16(w) are timing charts showing operation of the word line activation controller in relation to blocks 20A–20D during the operation cycles shown in FIGS. 15(a)–15(q)

As regards the second block 20B, since external access has already been performed in the second cycle, operation is the same as in FIGS. 16(*a*)–16(*w*). As regards the third and fourth blocks 20C, 20D, since there is no request for external access, operation is essentially the same as in FIGS. 16(*a*)–16(*w*). However, as the refresh timing signal RFTM rises at a different point in time, the timing of the refresh operation is different.

Operation after all of the refresh request signals RFREQ0–RFREQ3 have returned to L level is analogous to that in FIGS. 13(*a*)–13(*w*).

Figure 15:
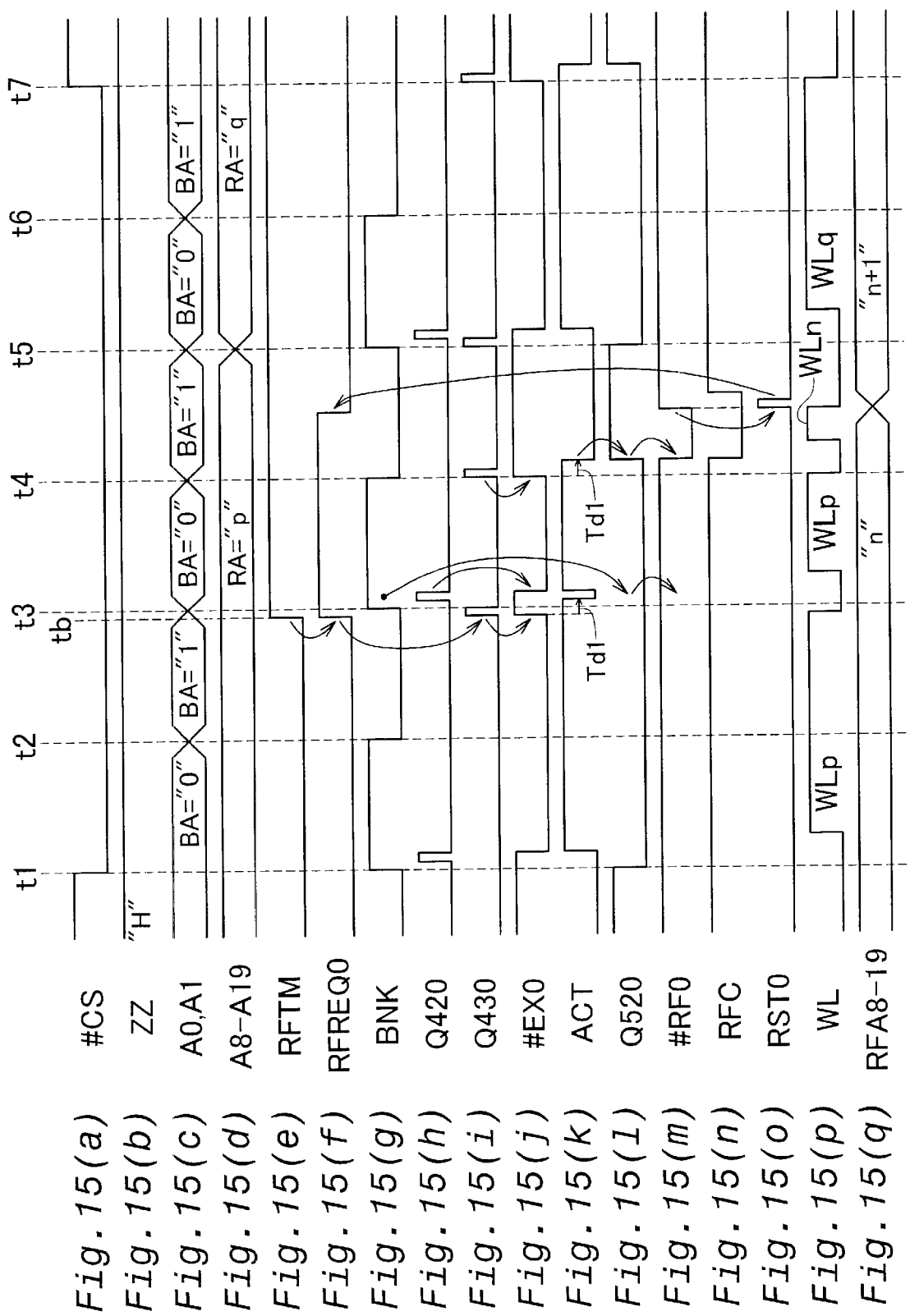
FIGS. 15(a)–15(q) are timing charts showing operation of the word line activation controller in relation to first block 20A in the event of a refresh request occurring at a different time than in FIGS. 12(a)–12(q)

As described with reference to FIGS. 15(*a*)–15(*q*) through 19(*a*)–19(*w*), where a word line in a first memory cell block has been activated, and there is a refresh request for the first memory cell block, the word line activation controller of this embodiment can deactivate the activated word line in the first memory cell block, with the proviso that no external access operations are currently being performed in the first memory cell block. When there is a request for external access to the first memory cell block within a predetermined period following the request to refresh the first memory cell block, the refresh operation on the first memory cell block is delayed, and a word line in the first memory cell block is activated in order to read or write data. In this way, precedence can be given to external access.

In the present embodiment, the predetermined period following a refresh request is set to essentially the same period as the period required for precharging for refresh operations. In preferred practice, this period essentially equal to the precharge period Tpr will be within ±20% of the period Tpr. In this way, precharging can be performed during the cycle period immediately preceding a cycle in which an external access request is made, so individual cycle length—namely, the shortest cycle Tcyc of change in address A0–A19—can be made relatively short.

D3. Operation in Standby Cycle and Snooze Mode

Both external access and refresh operations are enabled during operation cycles, whereas in standby cycle and snooze mode, external access is disabled, and only refresh operations are enabled.

Figure 20:
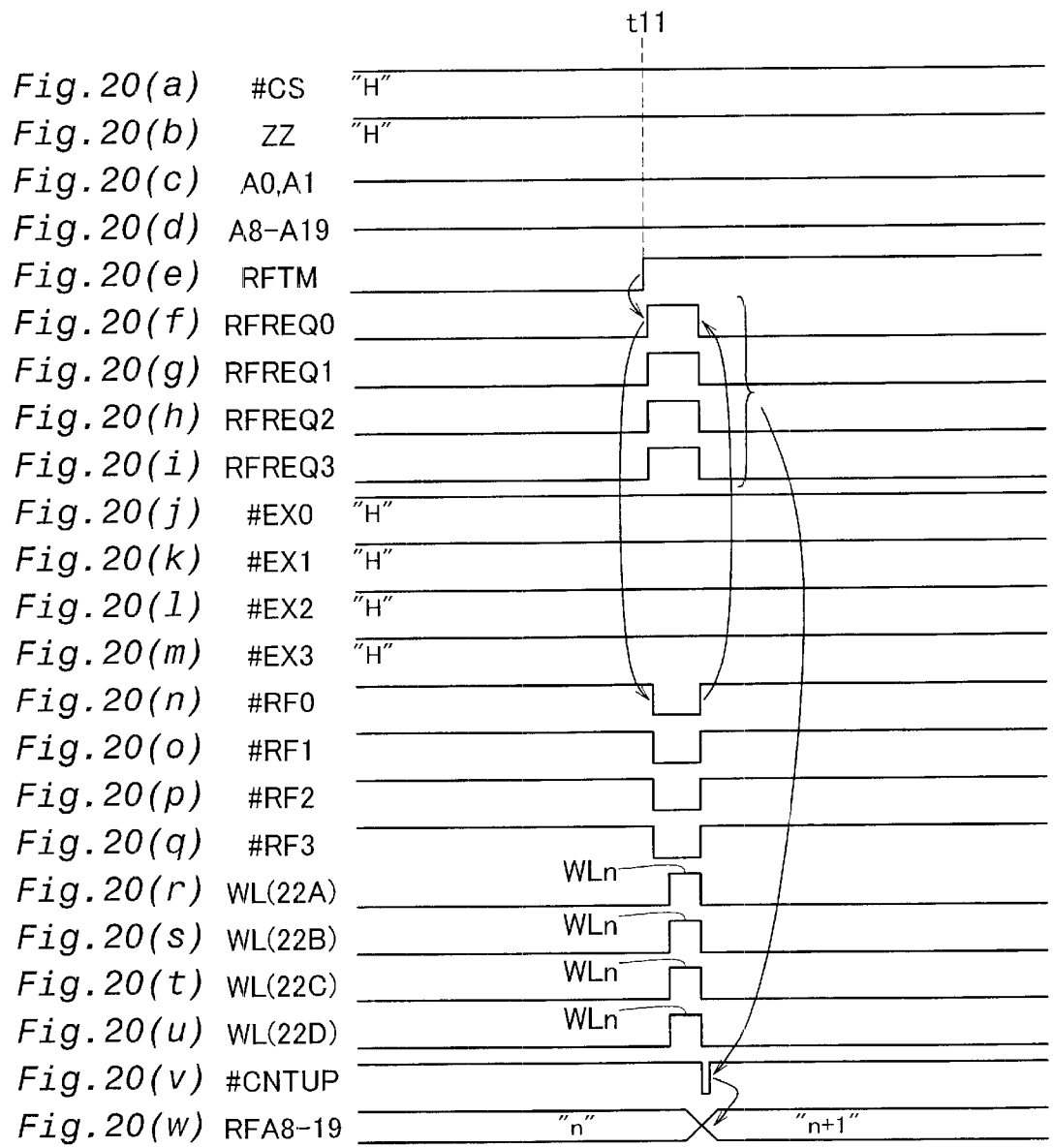
FIGS. 20(a)–20(w) are timing charts showing operation of the word line activation controller in relation to blocks 20A–20D during standby cycle.

FIGS. 20(*a*)–20(*w*) are timing charts showing operation of the word line activation controller in relation to blocks 20A–20D during standby cycle. In standby cycle, the chip select signal #CS (FIG. 20(*a*)) is H level (inactive) and the snooze signal ZZ (FIG. 20(*b*)) is H level. Since no external access operations are performed in standby cycle, external access signals #EX0–#EX3 (FIGS. 20(*j*)–20(*m*)) for the four blocks 20A–20D are set to H level (inactive).

When the refresh timing signal RFTM (FIG. 20(*e*)) rises at time t11, the refresh request signals RFREQ0–RFREQ3 (FIGS. 20(*f*)–20(*i*)) for the four blocks 20A–20D immediately rise to H level. At this time, refresh signals #RF0–#RF3 (FIGS. 20(*n*)–20(*q*)) fall to L level (active). As a result, the sane "n"th word lines WLn selected by the refresh address RFA9–RFA19 in each of the four blocks 20A–20D are activated (FIGS. 20(r)–20(u)), and all memory cells on the word lines are refreshed.

In this way, since external access to all blocks 20A–20D is disabled during the standby cycle, refresh operations are performed simultaneously on all four blocks 20A–20D.

Operation once all of the refresh request signals RFREQ0–RFREQ3 have returned to L level is analogous to that in FIGS. 13(a)–13(w).

FIGS. 20(a)–20(w) illustrate refresh operations during standby cycle; operation is the same in snooze mode.

As described above, in operation cycles, when notified by the refresh timing signal RFTM of the need to perform a refresh operation, the refresh operation is performed in a manner dependent on external access status (first refresh mode). In standby cycle and snooze mode, on the other hand, when notified by the refresh timing signal RFTM of the need to perform a refresh operation, simultaneous refresh operations are immediately performed on the four blocks 20A–20D.

E. Example of Application in an Electronic Device

Figure 21:
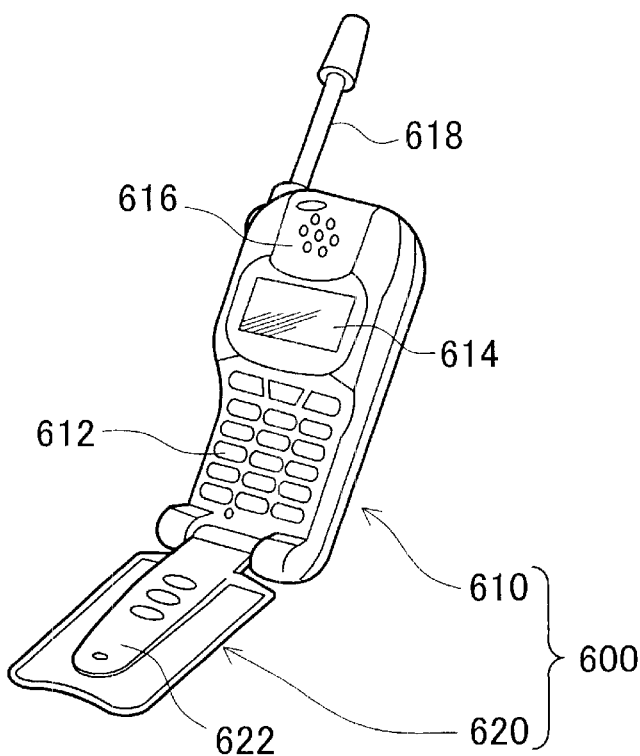
FIG. 21 is a perspective view of a mobile phone by way of an exemplary electronic device embodying the semiconductor memory device of the present invention.

FIG. 21 is a perspective view of a mobile phone by way of an exemplary electronic device embodying the semiconductor memory device of the present invention. Mobile phone 600 comprises a body 610 and a cover 620. Body 610 is provided with a keyboard 612, a liquid crystal display 614, a receiver 616, and a body antenna 618. Cover 620 is provided with a transmitter 622.

Figure 22:
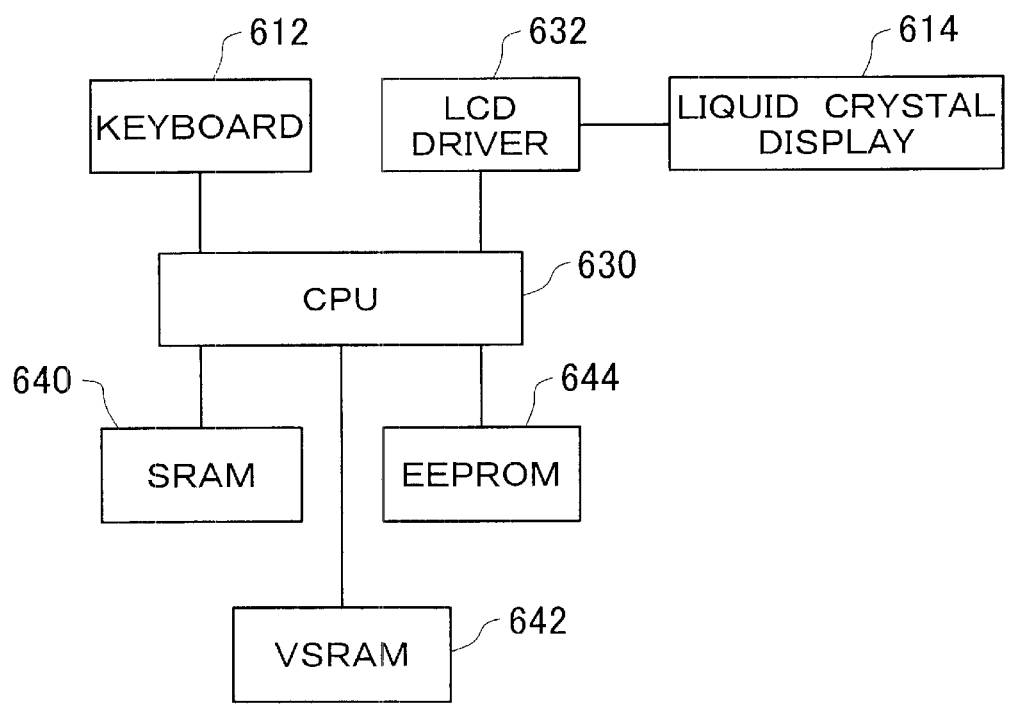
FIG. 22 is a block diagram showing the electronics of the mobile phone 600 of FIG. 21.

FIG. 22 is a block diagram showing the electronics of the mobile phone 600 of FIG. 21. CPU 630 is connected via a bus line to keyboard 612; an LCD driver 632 for driving liquid crystal display 614; an SRAM 640, a VSRAM 642; and an EEPROM 644.

SRAM 640 is used as a high speed cache memory, for example. VRAM 642 is used as a working memory for image processing, for example. Memory chip 300 may be used for VSRAM 642 (referred to as virtual SRAM or pseudo SRAM). EEPROM 644 contains various settings for the mobile phone 600.

When operation of mobile phone 600 is temporarily suspended, VSRAM 642 may be maintained in snooze mode. By so doing, internal refresh operations in VSRAM 642 will be performed automatically, enabling data in VSRAM 642 to be preserved. As the memory chip 300 of the embodiment has relatively large capacity, a further advantage is that large amounts of data—such as image data—can be held for extended periods.

The invention is not limited to the examples and embodiments set forth hereinabove, various modifications thereof being possible without departing from the scope and spirit of the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cell blocks composed of dynamic memory cells arranged in a matrix, the memory cell block including a plurality of word lines;
   an address input section for input of a multiple-bit address that includes a block address for selecting any one block from among the plurality of memory cell blocks, and a row address for selecting one of the plurality of word lines in the selected memory cell block;
   a data input/output section for input/output of data corresponding to a memory cell selected by the multiple-bit address; and
   a word line activation controller for controlling activation of the word lines;
   wherein the word line activation controller comprises:
      a row address transition detector for detecting whether the row address has changed;
   and wherein the word line activation controller is capable of
      (a) in a first case that the row address transition detector does not detect a change in the row address during consecutive cycles in which read or write operations of data for the memory cells are enabled and in which an identical row address is used, maintaining an activated state of a word line activated in a first memory cell block during an initial cycle of the consecutive cycles, without deactivation thereof until a final cycle of the consecutive cycles;
      (b) in a second case that a refresh request is issued to perform a refresh operation on the first memory cell block while the activated word line in the first memory cell block is maintained in the activated state, deactivating the activated word line in the first memory cell block if no read or write operations of data are currently being performed in the first memory cell block; and
      (c) in a third case that a read or write operation for the first memory cell block is requested within a predetermined period after the issuance of the refresh request to the first memory cell block, suspending the refresh operation for the first memory cell block, and activating the deactivated word line in the first memory cell block for the read or write operation of data.

2. The semiconductor memory device according to claim 1, wherein the address input section is simultaneously supplied with a column address as well as with the row address; and
   the row address is assigned to a plurality of upper bits of the multiple-bit address.

3. The semiconductor memory device according to claim 1, wherein the predetermined period is substantially equal to a period required for precharging bit lines in the first memory cell block.

4. The semiconductor memory device according to claim 1, wherein the word line activation controller is capable of:
   in the first case,
      maintaining the activated state of the word line activated in the first memory cell block during the initial cycle, without deactivation thereof until the final cycle;
      and additionally, when a read or write operation of data on a memory cell in a second memory cell block different from the first memory cell block is performed during any arbitrary cycle among the consecutive cycles after the initial cycle, maintaining an activated state of a word line activated in the second memory cell block during the arbitrary cycle, without deactivation thereof until the final cycle; and
   in the second case, where a refresh request is issued for a refresh operation on the second memory cell block as well as on the first memory cell block,
      deactivating the activated word line in the second memory cell block if no read or write operations of data are currently being performed in the second memory cell block.

5. A method for controlling activation of word lines in a semiconductor memory device comprising: a plurality of memory cell blocks composed of dynamic memory cells arranged in a matrix, the memory cell block including a plurality of word lines; an address input section for input of a multiple-bit address that includes a block address for selecting any one block from among the plurality of memory cell blocks, and a row address for selecting one of the plurality of word lines in the selected memory cell block; and a data input/output section for input/output of data corresponding to a memory cell selected by the multiple-bit address, wherein:

(a) in a first case that no change in the row address is detected during consecutive cycles in which read or write operations of data for the memory cells are enabled and in which an identical row address is used, an activated state of a word line activated in a first memory cell block during an initial cycle of the consecutive cycles is maintained without deactivation thereof until a final cycle of the consecutive cycles;

(b) in a second case that a refresh request is issued to perform a refresh operation on the first memory cell block while the activated word line in the first memory cell block is maintained in the activated state, the activated word line in the first memory cell block is deactivated if no read or write operations of data are currently being performed in the first memory cell block; and (c) in a third case that a read or write operation for the first memory cell block is requested within a predetermined period after the issuance of the refresh request to the first memory cell block, the refresh operation for the first memory cell block is suspended, and the deactivated word line in the first memory cell block for the read or write operation of data is activated.

6. The method according to claim 5, wherein the address input section is simultaneously supplied with a column address as well as with the row address; and the row address is assigned to a plurality of upper bits of the multiple-bit address.

7. The method according to claim 5, wherein the predetermined period is substantially equal to a period required for precharging bit lines in the first memory cell block.

8. The method according to claim 5, wherein:

in the first case,
  the activated state of the word line activated in the first memory cell block during the initial cycle is maintained without deactivation thereof until the final cycle;
  and additionally, when a read or write operation of data on a memory cell in a second memory cell block different from the first memory cell block is performed during any arbitrary cycle among the consecutive cycles after the initial cycle, an activated state of a word line activated in the second memory cell block during the arbitrary cycle is maintained without deactivation thereof until the final cycle; and in the second case, where a refresh request is issued for a refresh operation on the second memory cell block as well as on the first memory cell block,
  the activated word line in the second memory cell block is deactivated if no read or write operations of data are currently being performed in the second memory cell block.

* * * * *